United States Patent
Fomin et al.

(10) Patent No.: US 10,826,739 B1
(45) Date of Patent: Nov. 3, 2020

(54) SYSTEMS AND METHODS FOR EFFICIENT CLIPPING IN CREST FACTOR REDUCTION PROCESSES

(71) Applicant: NanoSemi, Inc., Waltham, MA (US)

(72) Inventors: Dmitri Fomin, Hopkinton, MA (US); Zohaib Mahmood, Westwood, MA (US); George Oliver Stone, IV, Hollis, NH (US); Bhupinder S Parhar, Princeton, NJ (US); Gordon Cheung, Sudbury, MA (US)

(73) Assignee: NanoSemi, Inc., Sudbury, MA (US)

(*) Notice: Subject to any disclaimer, the term of this patent is extended or adjusted under 35 U.S.C. 154(b) by 0 days.

(21) Appl. No.: 16/528,732

(22) Filed: Aug. 1, 2019

(51) Int. Cl.
H04L 27/26 (2006.01)
H03H 17/02 (2006.01)

(52) U.S. Cl.
CPC ..... H04L 27/2623 (2013.01); H03H 17/0202 (2013.01); H04L 27/2621 (2013.01)

(58) Field of Classification Search
CPC ............ H04L 27/2623; H04L 27/2621; H03H 14/0202; H03H 14/0248
USPC ........................................................ 375/260
See application file for complete search history.

(56) References Cited

U.S. PATENT DOCUMENTS

| | | | |
|---|---|---|---|
| 6,879,642 B2 | 4/2005 | Taskinen | |
| 7,643,801 B2 | 1/2010 | Piirainen | |
| 7,839,951 B2 | 11/2010 | Cai et al. | |
| 8,457,249 B2 | 6/2013 | Gotman et al. | |
| 8,619,903 B2 | 12/2013 | Schmidt et al. | |
| 2002/0107673 A1* | 8/2002 | Haller | G06T 19/20 703/1 |
| 2004/0076247 A1 | 4/2004 | Barak et al. | |
| 2006/0154622 A1 | 7/2006 | Piirainen | |
| 2008/0019453 A1 | 1/2008 | Zhao et al. | |
| 2008/0101502 A1 | 5/2008 | Navidpour et al. | |
| 2010/0042956 A1* | 2/2010 | Lan | G06F 13/1663 716/132 |
| 2014/0269984 A1* | 9/2014 | Piazzi | H04L 1/0033 375/296 |

OTHER PUBLICATIONS

Nakamura, T., Kimura, S., Saito, M., Okada, M. (2019), "A Novel Low Complexity Clipping Method for OFDM Signals".

(Continued)

Primary Examiner — Kevin M Burd
(74) Attorney, Agent, or Firm — Occhiuti & Rohlicek LLP

(57) ABSTRACT

Disclosed are methods, systems, devices, apparatus, media, design structures, and other implementations, including a method for crest factor reduction (CFR) processing that includes receiving a first complex-valued sample of a signal for radio transmission, determining a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane, and processing the signal using the determined clipped complex-valued sample to produce a resultant CFR signal.

19 Claims, 18 Drawing Sheets

(56) References Cited

OTHER PUBLICATIONS

Andraka, R. (1998), "A survey of CORDIC algorithms for FPGA based computers", Proceedings of the 1998 ACM/SIGDA sixth international symposium on Field Programmable Gate Arrays, pp. 191-200.
Hill, G., Faulkner, M. (2002), "Comparison of low complexity clipping algorithms for OFDM", Proc. 13th IEEE International Symposium on Personal Indoor and Mobile Radio Communications (PIMRC) 2002.
Lakshmi, B., Dhar, A.S. (2009), "CORDIC Architectures: A Survey," VLSI Design, vol. 2010.

* cited by examiner

310

```
// clips complex sample using thresholds th and thx = th / sqrt(2)
// returns true if "peak" detected
#define CxPI8 1892 // 2048 * cos(pi/8)
#define SxPI8 784 // 2048 * sin(pi/8)
bool rpClip_08(t_in ur, t_in ui, t_pe th, t_pe thx, t_in *vr, t_in *vi)
{
        bool flipRe, flipIm, flipXY;
        t_in uRe, uIm, vRe, vIm, tmp;
        // flip wrt Y-axis; make uRe nonnegative
        if (ur < 0) { uRe = -ur; flipRe = true; }
        else { uRe = ur; flipRe = false; }
        // flip wrt X-axis; make uIm nonnegative
        if (ui < 0) { uIm = -ui; flipIm = true; }
        else { uIm = ui; flipIm = false; }
        // quick rejection
        if (uRe < thx && uIm < thx) { *vr = ur; *vi = ui; return false; }
        // flip wrt (x=y)-line; make x >= y
        if (uRe < uIm) {tmp = uIm; uIm = uRe; uRe = tmp; flipXY = true;}
        else { flipXY = false; };
        // find the ``best'' angle; in this case pi/8
        t_in cx = CxPI8;
        t_in sx = SxPI8;
        // rotate clockwise: (x,y) --> (x*cos + y*sin, y*cos - x*sin)
        t_in rRe = (uRe * cx + uIm * sx) >> HCPI;
        t_in rIm = (uIm * cx - uRe * sx) >> HCPI;
        // if required, project onto x = th
        bool status = false;
        if (rRe > th) { rRe = th; status = true; }
        // rotate counterclockwise: (x,y) --> (x*cos - y*sin, y*cos + x*sin)
        vRe = (rRe * cx - rIm * sx) >> HCPI;
        vIm = (rIm * cx + rRe * sx) >> HCPI;
        // do the reverse flips
        if (flipXY) {tmp = vIm; vIm = vRe; vRe = tmp;}
        if (flipRe) vRe = -vRe;
        if (flipIm) vIm = -vIm;
        // assign the outputs
        *vr = vRe; *vi = vIm;
        return status;
}
```

*FIG. 3A*

```
// find the segment in the half-quadrant where (uRe, uIm) lies
t_ict idx = (1 << (NsCFR-1)), step = idx;
t_in cx, sx;
bool chk;
for (t_ict ss = 0; ss < NsCFR; ss++)
{
        step = (step >> 1);
        cx = csHRP[idx][0]; // look up cosine and sine values
        sx = csHRP[idx][1]; // for bisector angles (k + 1/2) * \pi/2^NsCFR
        // check if (uIm, uRe) lies above line y * cx - x * sx > 0
        chk = (uIm * cx > uRe * sx);
        if (chk)
        idx += step;
        else
        idx -= step;
}
if (!chk) idx--;

// get cosine/sine values for the "best" direction
cx = csDRP[idx][0];
sx = csDRP[idx][1];
```

FIG. 3B

```
#define NCFRT 4 // 2^{NsCFR-1}
#define MRPT 4 // number of binary fractions for
pseudo-multiplication
// order-4 representations for cos(gamma_k), k = 0,..., 7
// (gamma_k being arithmetic mean of atan(k/8) and
atan((k+1)/8))
t_cpt cosRPt[] =
{
{ 0,-9,16,18,},
{ 0,-6,-10,-11,},
{ 0,-5,-6, 9,},
{ 0,-4,-6,-8,},
{ 0,-3,-9,-10,},
{ 0,-3,-4, 6,},
{ 0,-2, 5,-8,},
{ 1, 2,-6,-8,}
};
// order-4 representations for sin(gamma_k), k = 0,..., 7
t_cpt sinRPt[] =
{
    { 4,-12,-13,18,},
    { 3, 4,-8,15,},
    { 2, 4,-6,11,},
    { 1,-3, 5,-7,},
    { 1,-7,-8,10,},
    { 1, 4, 8,-10,},
    { 1, 3, 8,10,},
    { 1, 3, 4,-8,}
};
// fixed-point pseudo multiplication by a positive
number <= 1
// represented as sequence of 4 signed shift/adders
static t_in rptTimes(t_in x, t_cpt sh[MRPT])
{
    t_in y = 0;
    for (int ii = 0; ii < MRPT; ii++)
    {
        t_cpt s = sh[ii];
        if (s > HCPI || s < -HCPI)
            continue;
        if (s >= 0)
            y += (x >> s);
        else
            y -= (x >> (-s));
    }
    return y;
}
```

```
// find best approximation (with NsCFR bits) to tangent
uIm/uRe
t_ict d = 0, step = NCFRT;
t_in x = uRe >> 1;
t_in y = uIm, tau;
for (t_ict ss = 0; ss < NsCFR; ss++)
{
    tau = y - x;
    if (tau >= 0)
    {
        y = tau;
        d[NsCFR-1-ss] = 1; // (NsCFR-1-ss)-th
                              bit of d
    }
    x = x >> 1;
    step = step >> 1;
}
// take the "best" approximating direction, look up its
cosine/sine
t_cpt *cx = cosRPt + d * MRPT;
t_cpt *sx = sinRPt + d * MRPT;
```

```
// rotate clockwise; we only need real part
t_in rRe = rptTimes(uRe, cx) + rptTimes(uIm, sx);
// "project-clip" onto line x = th
bool status = false;
tau = rRe - th;
if (tau > 0)
{
status = true;
vRe = uRe - rptTimes(tau, cx);
vIm = uIm - rptTimes(tau, sx);
...
}
...
return status;
```

```
#define NDST 3 // number of dichotomy steps
#define MxDST 4 // 2^{NDCT-1}
define MRPT 4 // number of binary fractions for pseudo-multiplication // order-4 representations for 1/cos(gamma_k), k = 0,..., 7
// (gamma_k being arithmetic mean of atan(k/8) and atan((k+1)/8))
t_cpt secRPt[] =
{
        { 1, 9,-16,-19,},
        { 1, 6, 9, -12,},
        { 1, 4,-6, 11,},
        { 1, 4, 5, -9, },
        { 1, 3, 6, 7, },
        { 1, 2,-5, -7, },
        { 1, 2, 5, 7, },
        { 1, 2, 3, -8, }
};

// find best approximation (with NsCFR bits) to tangent uIm/uRe
t_ict d = 0, step = NCFRT;
t_in x = uRe >> 1;
t_in y = uIm, tau;
for (t_ict ss = 0; ss < NsCFR; ss++)
{
        tau = y - x;
        if (tau >= 0)
        {
                y = tau;
                d[NsCFR-1-ss] = 1; // (NsCFR-1-ss)-th bit of d
        }
        x = x >> 1;
        step = step >> 1;
}

// take the "best" approximating direction, look up its secant
// and multiply uRe by that number - that will give us the
// length of the original vector
t_cpt *cx = secRPt + d * MRPT;
t_pe p = rptTimes(uRe, cx);
```

*FIG. 3D*

```
#define CPI 13 // t_in bitwidth (input signal)
#define BCPI (CPI-1) // quantization factor #1
#define HCPI (CPI-2) // quantization factor #2
#define NsCFR 3 // number of steps in binary search
typedef ap_int<13> t_in; // inputs (inp)
typedef ap_uint<13> t_pe; // thresholds etc
typedef ap_int<6> t_cpt; // shifts
typedef ap_int<14> t_inx; // internal computations
```

```
// clips complex sample using threshold th; returns true if "peak" detected
bool idealClip(t_in ur, t_in ui, t_pe th, t_in *vr, t_in *vi)
{
        double upw = sqrt((double)(ur * ur + ui * ui)); // [*]
        if (upw > th)
        {
                *vr = round((1/upw) * (double)(ur * th)); // [**]
                *vi = round((1/upw) * (double)(ui * th)); // [**]
                return true;
        }
        else
        {
                *vr = ur;
                *vi = ui;
                return false;
        }
}
```

*FIG. 5A*

```
// linear (one-dimensional) clipping; returns true if
// abs.value exceeds the threshold th
static bool linClip(t_inx x, t_inx th, t_cfr *xs)
{
        bool status = false;
        t_in t = x;
        if (t > th)
        {
                t = th;
                status = true;
        }
        if (t < -th)
        {
                t = -th;
                status = true;
        }
        *xs = t;
        return status;
}
// returns true if "peak" detected (the point is outside the square)
static bool squareClip(t_inx ur, t_inx ui, t_pe th, t_inx *vr, t_inx *vi)
{
        bool status = false;
        t_cfr tr = ur, ti = ui;
        status = linClip(ur, th, &tr) || status;
        status = linClip(ui, th, &ti) || status;
        *vr = tr;
        *vi = ti;
        return status;
}
// clips complex sample using thresholds th and thx = th * sqrt(2)
// returns true if "peak" detected
bool octagonClip(t_in ur, t_in ui, t_pe th, t_pe thx, t_in *vr, t_in *vi)
{
        bool status = false;
        t_cfr tr, ti, xr, xi;
        status = squareClip(ur, ui, th, &xr, &xi) || status;
        tr = xr - xi;
        ti = xr + xi;
        status = squareClip(tr, ti, thx, &xr, &xi) || status;
        *vr = (t_in)((xr + xi)>>1);
        *vi = (t_in)((xi - xr)>>1);
        return status;
}
```

*FIG. 5B*

```
// th - clipping level (threshold)
// thx - th * q
// q = 1.1614116 = sqrt(5/4 * 17/16 * 65/64); 3 rotation
steps
bool rpClip_08(t_in ur, t_in ui, t_pe th, t_pe thx, t_in
*vr, t_in *vi)
{
        bool flipRe, flipIm, flipXY;
        t_in x, y, tmp;
        // flip wrt Y-axis; make uRe nonnegative
        if (ur < 0)
                { x = -ur; flipRe = true; }
        else
                { x = ur; flipRe = false; }
        // flip wrt X-axis; make uIm nonnegative
        if (ui < 0)
                { y = -ui; flipIm = true; }
        else
                { y = ui; flipIm = false; }
        // flip wrt (x=y)-line; make x >= y
        if (x < y)
                { tmp = y; y = x; x = tmp; flipXY =
                true;}
        else
                { flipXY = false };
bool rots[3];
uint32_t ss, ts = 1;
// run "cordic" method cycle for NsCFR more steps
for (ss = 0; ss < NsCFR; ss ++)
{
        x1 = x;
        // if point is above X-axis, rotate clockwise;
        // multiply by (1, -tan): (x, y) --> (x + y * t, y -
                x * t) ;
        bool above_x = (y > 0);
        if (above_x)
        {
                x = x1 + (y >> ts);
                y = y - (x1 >> ts);
        }
        // if point is above X-axis, rotate
        counterclockwise;
        // multiply by (1, tan): (x, y) --> (x - y * t, y + x
                * t) ;
        else
        {
                x = x1 - (y >> ts);
                y = y + (x1 >> ts);
        }
```

```
        rots[ss] = above_x;
        ts++;
}
// clip
x = thx;

// rotate the result back
ts = 1;
for (ss = 0; ss < NsCFR; ss ++)
{
        x1 = x;
        if (rots[ss])
        {
                x = x1 - (y >> ts);
                y = y + (x1 >> ts);
        }
        else
        {
                x = x1 + (y >> ts);
                y = y - (x1 >> ts);
        }
        ts++;
}
// divide by q^2
x = (x - (x >> 2) - (x >> 7) + (x >> 10));
y = (y - (y >> 2) - (y >> 7) + (y >> 10));

// do the reverse flips
        if (flipXY) {tmp = y; y = x; x = y;}
        if (flipRe) x = -x;
        if (flipIm) y = -y;
        // assign the outputs
        *vr = x; *vi = y;
        return status;
}
```

```
// linear (one-dimensional) clipping; returns true if
// abs.value exceeds the threshold th
static bool linClip(t_inx x, t_inx th, t_cfr *xs)
{
        bool status = false;
        t_in t = x;
        if (t > th)
        {
                t = th;
                status = true;
        }
        if (t < -th)
        {
                t = -th;
                status = true;
        }
        *xs = t;
        return status;
}
// returns true if "peak" detected (the point is outside the square)
static bool squareClip(t_inx ur, t_inx ui, t_pe th, t_inx *vr, t_inx *vi)
{
        bool status = false;
        t_cfr tr = ur, ti = ui;
        status = linClip(ur, th, &tr) || status;
        status = linClip(ui, th, &ti) || status;
        *vr = tr;
        *vi = ti;
        return status;
}
// clips complex sample using thresholds th and thx = th * sqrt(2)
// returns true if "peak" detected
bool octagonClip(t_in ur, t_in ui, t_pe th, t_pe thx, t_in *vr, t_in *vi)
{
        bool status = false;
        t_cfr tr, ti, xr, xi;
        status = squareClip(ur, ui, th, &xr, &xi) || status;
        tr = xr - xi;
        ti = xr + xi;
        status = squareClip(tr, ti, thx, &xr, &xi) || status;
        *vr = (t_in)((xr + xi)>>1);
        *vi = (t_in)((xi - xr)>>1);
        return status;
}
```

SYSTEMS AND METHODS FOR EFFICIENT CLIPPING IN CREST FACTOR REDUCTION PROCESSES

BACKGROUND

The present disclosure relates to crest factor reduction.

In many communication systems, it is desirable that the peak amplitude of a signal be limited relative to an average, e.g., relative to an average root-mean-square (RMS) or average absolute magnitude. An amplification component for a radio frequency power amplifier, for example, may exhibit substantial distortion beyond a certain output amplitude, and therefore to avoid introducing distortion resulting from such a limit (e.g., "clipping"), it is desirable to pre-process the signal so that the input signal does not cause distortion in the output.

For signals with complex-valued samples, ideal clipping operation may be implemented through a circle projection function, where a complex-valued sample z=x+iy is projected onto a circle of radius h, to obtain the projected (clipped) value z' according to:

$$z' = f(z, h); f(z, h) = z\frac{h}{|z|} = z\frac{h}{\sqrt{x^2 + y^2}}$$

The above ideal clipping operation involves square root and division operation, which is thus computationally complex. Performing those computationally-complex operation multiple times (e.g., with respect to multiple samples of a signal x[n], for which clipping is to be performed) ties up computational resources and can lead to processor inefficiencies.

SUMMARY

In a general aspect, an approach to crest factor reduction (CFR) processing makes use of a low-computation clipping approach in which complex-values samples are clipped according to a procedure with a reduced number of computations. In some embodiments, the clipping approach realized is one based on a selective projection procedure in which the "best" projection surface (e.g., one of a plurality of tangent lines) is independently selected for different samples.

Accordingly, in some variations, a method for crest factor reduction (CFR) processing is provided. The method includes receiving a first complex-valued sample of a signal for radio transmission, determining a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane, and processing the signal using the determined clipped complex-valued sample to produce a resultant CFR signal.

Embodiments of the method may include at least some of the features described in the present disclosure, including one or more of the following features.

Determining the clipped complex-valued sample may include mapping, using a sequence of mapping operations, the first complex-valued sample to the associated second complex-valued sample located in a mapped region of the complex-valued plane, selecting an optimal line from the plurality of different tangent lines, projecting the second complex-valued sample to the optimal line selected from the plurality of different tangent lines, and applying a reverse-mapping sequence, based on the sequence of mapping operations, to compute the clipped complex-valued sample.

The mapped region may be a bisector region of a first quadrant of an x-y plane satisfying the constraints x≥0, y≥0, and x≥y.

Determining the clipped complex-valued sample may include selecting the one of the plurality of different tangent lines according to a binary search performed to select a vector, $\vec{a}$, from a plurality of vectors, with an associated direction closest to a sample direction defined for the second complex-valued sample, with each of the plurality of vectors being associated with a respective vector direction computed according to $(\cos(\alpha_j), \sin(\alpha_j))$, and with $\alpha_j$ being an angle defined between a point of origin of the complex-valued plane and a respective intersection point for the $j^{th}$ line of the plurality of tangent lines with the circle representation.

Determining the clipped complex-valued sample may include selecting the one of the plurality of different tangent lines according to a tangent value, selected from a plurality of tangent values, closest to a sample tangent value computed for the second complex-valued sample, with each of the plurality of tangent values corresponding to a tangent value, $\tan(\alpha_j)$, and with $\alpha_j$ being an angle defined between a point of origin of the complex-valued plane and a respective intersection point for the $j^{th}$ line of the plurality of tangent lines with the circle representation.

Selecting the one of the plurality of different tangent lines may include selecting the one of the plurality of different tangent lines according to a binary search performed to select the tangent value, from the plurality of tangent values, closest to the sample tangent value computed for the second complex-valued sample.

At least some of the plurality of different tangent lines may be defined in pre-determined orientations such that determination of the clipped complex-valued sample is computed, at least in part, based on pseudo-multiplication operations that reduce the number of actual multiplication operations required to determine the clipped complex-valued sample.

The value h may represent the magnitude of a complex-valued clipping threshold.

The second complex-valued sample may be the first complex-valued sample.

In some variations, a crest factor reduction (CFR) system is provided that includes a controller configured to receive a first complex-valued sample of a signal for radio transmission, determine a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane, and process the signal using the determined clipped complex-valued sample to produce a resultant CFR signal. The CFR system further includes an amplifier to amplify the resultant CFR signal.

Embodiments of the CFR system may include at least some of the features described in the present disclosure, including any of the above method features, as well as one or more of the following features.

The controller may include a filter chain, configured to apply to the received signal CFR processing based on clipping the received signal according to, at least in part, the determined clipped complex-value sample, the filter chain comprising one or more CFR stages that each includes a respective clipping module coupled, at an output of the respective clipping module, to a respective filter.

The controller configured to determine the resultant clipped complex-valued sample may be configured to map, using a sequence of mapping operations, the first complex-valued sample to the associated second complex-valued sample located in a mapped region of the complex-valued plane, select an optimal line from the plurality of different tangent lines, project the second complex-valued sample to the optimal line selected from the plurality of different tangent lines, and apply a reverse-mapping sequence, based on the sequence of mapping operations, to compute the clipped complex-valued sample.

The controller configured to determine the clipped complex-valued sample may be configured to select the one of the plurality of different tangent lines according to a binary search performed to select a vector, $\vec{a}$, from a plurality of vectors, with an associated direction closest to a sample direction defined for the second complex-valued sample, with each of the plurality of vectors being associated with a respective vector direction computed according to $(\cos(\alpha_j), \sin(\alpha_j))$, and with $\alpha_j$ being an angle defined between a point of origin of the complex-valued plane and a respective intersection point for the $j^{th}$ line of the plurality of tangent lines with the circle representation The controller configured to determine the clipped complex-valued sample may be configured to select the one of the plurality of different tangent lines according to a binary search performed to select a tangent value, from a plurality of tangent values, closest to a sample tangent value computed for the second complex-valued sample, with each of the plurality of tangent values corresponding to a tangent value, $\tan(\alpha_j)$, and with $\alpha_j$ being an angle defined between a point of origin of the complex-valued plane and a7 respective intersection point for the $j^{th}$ line of the plurality of tangent lines with the circle representation.

In some variations, a design structure encoded on a non-transitory machine-readable medium is provided, with the design structure comprising elements that, when processed in a computer-aided design system, generate a machine-executable representation of a crest factor reduction system that includes a receiving circuit to receive a first complex-valued sample of a signal for radio transmission, a determining circuit to determine a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane, and a processing circuit to process the signal using the determined clipped complex-valued sample to produce a resultant CFR signal.

In some variations, a non-transitory computer readable media is provided, that is programmed with instructions, executable on a processor, to receive a first complex-valued sample of a signal for radio transmission, determine a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane, and process the signal using the determined clipped complex-valued sample to produce a resultant CFR signal.

Embodiments of the design structure and/or the computer readable media may include at least some of the features described in the present disclosure, including any of the above method features and/or the system features.

Other features and advantages of the invention are apparent from the following description, and from the claims.

BRIEF DESCRIPTION OF THE DRAWINGS

These and other aspects will now be described in detail with reference to the following drawings.

FIGS. 3A-3D are code listings for example clipping procedures.

FIGS. 5A-D are code listings for various clipping approaches (e.g., legacy clipping approaches).

Like reference symbols in the various drawings indicate like elements.

DESCRIPTION

Figure 1:
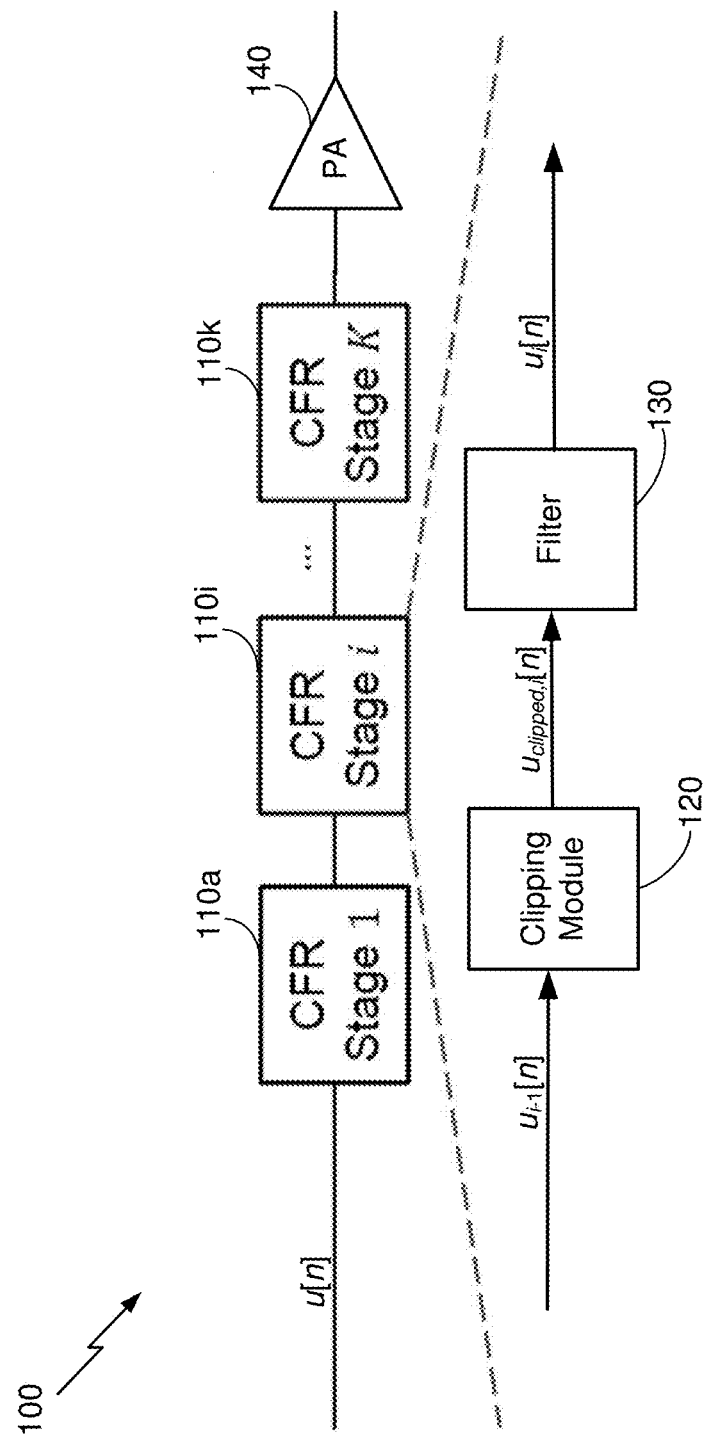
FIG. 1 is a diagram of an example multi-stage crest factor reduction (CFR) system configured to implement the clipping approaches described herein.

Disclosed herein are methods, systems, devices, media, and other implementations, for low-computation crest factor reduction (CFR) approach based on a clipping procedure in which an "optimal" or "near-optimal" clipped sample is derived for a complex-valued sample. The use of an optimal or near-optimal clipped value can achieve optimal, or near-optimal, crest factor reduction (CFR). In this type of pre-processing, the "crest factor" may be defined as a ratio of a peak value to the average RMS value of a signal waveform. Thus, in some embodiments, a method for crest factor reduction (CFR) processing is provided that includes receiving a first complex-valued sample (e.g., the sample z) of a signal for radio transmission, determining a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane, and processing the signal using the determined clipped complex-valued sample to produce a resultant CFR signal.

In the present disclosure, the following terminology will be used. The quantity "peak-to-average power ratio" (PAPR) is defined as the peak amplitude squared (giving the peak power) divided by the RMS value squared (giving the average power), so PAPR is equal to the square of Crest Factor (CF). However, when expressed in a logarithmic scale (decibels or dB) PAPR value is the same as CF. Various measures of distortion may characterize the effect of the preprocessing. For example, an error vector magnitude (EVM) may be defined as the square root of the mean error power divided by the square root of a reference power (e.g., the maximum power of the coding constellation), expressed in decibels or as a percentage. Another measure of distortion relates to a spreading of signal energy outside the desired signal band, for example, measured as an "adjacent channel power ratio" (ACPR) and defined as a ratio between the total power in adjacent channels (e.g., an intermodulation signal) to the desired channel's power.

A variety of approaches may be used for CFR. One approach involves upsampling and then clipping the signal, followed by filtering the clipped signal to reduce distortion (e.g., in the form of ACPR). Alternatively, either the upsampling or filtering operations may be excluded in some embodiments. Because the filtering may itself introduce new amplitude peaks, this process may be repeated multiple times. In some such approaches, the level at which the signal is clipped may be reduced from stage to stage to progressively meet the target maximum amplitude relative to the RMS value. In another approach, the upsampled signal is clipped, and the amount by which this signal exceeds the clipping signal is filtered by a predefined filter or multiplied by a predefined time-domain window centered at a time location of the peak amplitude (i.e., so that is appropriately band limited), and subtracted from the signal. Again, in such an approach, the process may be repeated in several stages because the filtering or windowing may introduce new peak amplitudes beyond the limit.

As noted, a common approach to perform CFR is based on clipping signal samples. In that approach, a sample's value is clipped according to a function that depends on a pre-determined threshold. For example, for complex-valued samples, a pre-determined threshold, h, may correspond to a circle in a complex plane with a radius h. If the sample had only a real value x, the clipping would, for example, correspond, to reducing the value of x to h. In some embodiments, the clipping operation may be followed by filtering the clipped signal to reduce distortion. Because the filtering may itself introduce new amplitude peaks, this process may be repeated multiple times. In some such approaches, the level at which the signal is clipped may be reduced from stage to stage to progressively meet some optimization criterion (e.g., achieving a spectral filling in the area under the spectral envelope, as more particularly discussed in PCT application No. PCT/US2018/060021, entitled "Spectrum Shaping Crest Factor Reduction," the content of which is hereby incorporated by reference in its entirety). In some embodiments, the clipping operation performed on the samples may be preceded by an upsampling operation.

Thus, with reference to FIG. 1, a block diagram of an example CFR architecture 100 that may be realized to implement the clipping procedures described herein is shown. As illustrated, the example architecture 100 may include multiple sequential CFR stages 110a-k (although, in some embodiments, only a single CFR stage system may be realized). The processing performed by the various stages is more particularly illustrated in relation to the CFR stage i (i.e., implemented in unit 110i). As shown, the circuitry of the $i^{th}$ CFR stage, 110i, receives the input signal $u_{i-1}[n]$ (i.e., the output of the CFR stage preceding the $i^{th}$ stage). The input signal $u_{i-1}[n]$ may comprise complex-valued samples. A clipping module 120 is configured to compute from the complex-valued samples of the input signal $u_{i-1}[n]$, clipped samples ($u_{clipped,i}$), according to, for example, a procedure based on projecting a complex-valued input sample (or some resultant sample derived from the input sample) onto a selected one of a plurality of different tangent lines defined in the complex plane. The clipping module 120 is configured to select the tangent line (or some other projection surface, selected from a plurality of candidate projection surfaces) satisfying some criterion, e.g., select the tangent line at an intersection point with a pre-determined circle representation that defines an angle corresponding to a direction vector that is closest to the direction defined for the complex-valued sample. In some embodiments, the selection of "best" tangent line is performed according to a binary search using pre-determined values (e.g., direction vectors, tangent values, or some other value representative of the tangent lines and their orientations in the complex-valued plane). The clipping values is further configured to derive a projection (that is, or is associated with, the desired clipped complex-valued sample) of the complex-valued sample onto the selected projection surface (tangent line). Thus, in such embodiments, the clipping module 120 (which may be realized using a controller such as a processor-based device) is configured to receive a first complex-valued sample of a signal for radio transmission, determine a resultant clipped complex-valued sample for the first complex-valued sample, resulting from projection of a second complex-valued sample (associated with the first complex-valued sample) into a selected one of a plurality of different tangent lines that are tangential to a circle representation with a radius h in a complex-valued plane, and process the signal using the determined clipped complex-valued sample to produce a resultant CFR signal.

The clipped signal for the $i^{th}$ CFR stage (e.g., $u_{chipped,i}$, comprising one or more samples) is then provided to a filter 130 (e.g., a lowpass filter, which may be implemented as an FIR filter) to reduce distortion resulting from clipping the signal. The output of the CFR cascade (i.e., at the output of the stage 110k) is provided to a power amplifier 140. The CFR processing applied to an input signal u[n] (provided to the first CFR stage 110a) will generally result in reduced non-linear behavior of the power amplifier 140 than the non-linear behavior that would have resulted without performing the CFR processing. The filter 130 may be realized to exhibit different filter behaviors, including lowpass filtering behavior, bandpass filtering behavior, highpass filtering behavior, or any other filter behavior (e.g., represented through different frequency responses).

In some embodiments, the clipping module 120 may implement a rotate-and-project clipping approach. This approach may be based on phase angle approximation using a simple dichotomy, and is also referred to as the Angle Approximation Power/Clip computation (or AAPC). In such an approach, complex-valued samples are first mapped into a specific region of the complex plane, and the corresponding mapped samples are then projected into a selected one of tangent lines in that region. The approach includes first determining the best tangent line (within the mapped region) to which the mapped sample is to be projected onto. Upon projecting the sample to the selected surface, the resultant projection is reverse-mapped (reversing the sequence of operations that were first applied on the input sample to map into the more compact mapped region) to derive the true clipped sample on which downstream CFR processing is to be applied (e.g., whether to be filtered, fed to a PA, or provided to another CFR stage). In some embodiments, and as will be discussed in greater detail below, the rotate-and-project approach may be one based on selection of tangent values from a set of pre-determined tangent values associated with respective tangent lines.

With continued reference to FIG. 1, the architecture 100 illustrated in FIG. 1 may be at least part of a digital front end of a device or system (such as a network node, e.g., a WWAN base station or a WLAN access point, or of a mobile device). As such, the system 100 may be electrically coupled to communication modules implementing wired communications with remote devices (e.g., via network interfaces for wired network connection such as through ethernet), or wireless communications with such remote devices. In some embodiments, the architecture 100 may be implemented locally within a device or system to perform processing (predistortion processing or otherwise) on various signals produced locally in order to generate a resultant processed signal (whether or not that resultant signal is then communicated to a remote device).

In some embodiments, at least some functionality of the architecture 100 may be implemented using a controller (e.g., a processor-based controller) included with one or more of the modules/units of the architecture 100. The controller may be operatively coupled to the various modules or units of the CFR architecture 100, and may be configured to compute clipped samples (from input complex-valued sample) based, for example, on the rotate-and-project approaches discussed herein, and otherwise perform CFR processing (as well as other types of signal processing, such as digital predistortion, or DPD, processing). The controller may include one or more microprocessors, microcontrollers, and/or digital signal processors that provide processing functionality, as well as other computation and control functionality. The controller may also include special purpose logic circuitry, e.g., an FPGA (field programmable gate array), an ASIC (application-specific integrated circuit), a DSP processor, a graphics processing unit (GPU), an accelerated processing unit (APU), an application processor, customized dedicated circuitry, etc., to implement, at least in part, the processes and functionality for the system 100. The controller may also include memory for storing data and software instructions for executing programmed functionality within the device. In general, a computer accessible storage medium may include any non-transitory storage media accessible by a computer during use to provide instructions and/or data to the computer. For example, a computer accessible storage medium may include storage media such as magnetic or optical disks and semiconductor (solid-state) memories, DRAM, SRAM, etc.

In some implementations, a computer accessible non-transitory storage medium includes a database (also referred to as a "design structure" or "integrated circuit definition dataset") representative of a system/architecture including some or all of the components of the crest factor reduction systems described herein. In general, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represents the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

As noted, the architecture 100 is configured to implement (e.g., at each of the CFR stages depicted in FIG. 1, at a single one of the CFR stages, or at some of the CFR stages), complex-valued sample clippings, according to efficient, yet substantially precise, rotate-and-project operations to project an input sample to a selected one of a plurality of tangent lines within a complex plane. More particularly, in an example rotate-and-project approach, the polar angle of an input sample z needs to be determined. To achieve better precision, the sample z is flipped (rotated) with respect to the X-axis, Y-axis, and the line x=y (i.e., the first quadrant bisector) to thus ensure that for the mapped sample x≥0, y≥0, and x≥y. It is noted that some of these flips can be skipped (if, for instance, the x-coordinate of z is already non-negative). These rotation operations ensure, in the above example embodiments, that the resultant rotated sample will lie in lower half of the first quadrant. It is to be noted that in some embodiments, no initial rotation is performed, and thus the selection of one of a plurality of tangent lines may be over the entire complex-valued plane (i.e., the tangent lines or other projections surfaces will not be confined to a mapped region, but will include lines/surfaces in potentially all four quadrants of the complex-valued plane).

Figure 2A:
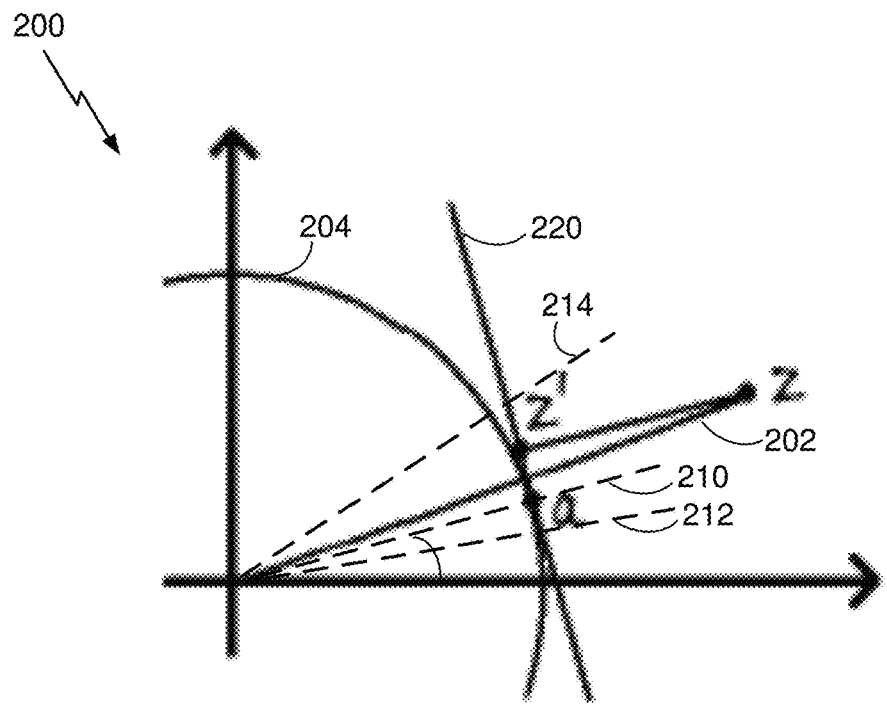
FIGS. 2A and 2B are example illustrations of clipping procedures that can be used with the approaches described herein.

When mapping is used, and having mapped the input complex-valued sample (also referred to herein as the "first complex-valued sample") into a resultant mapped sample (referred to herein as the "second complex-valued sample"), the rotate-and-project procedure is next used to select one of a plurality of tangent lines that will result in the "best" projection (and thus the "best" resultant clipped value) according to some criterion. In some examples, the "best" projection may correspond to a pre-determined line that is perpendicular to a corresponding (and possibly pre-computed) line that has the closest direction to a direction of the sample z. For example, and with reference to FIG. 2A, an example illustration 200 is provided that shows a sample z (which may be the input complex-valued sample, or a mapped version of the input sample) with a direction vector $\vec{r}$ (marked as line 202). Also shown are three possible vector lines 210, 212, and 214. These lines are generally pre-determined, and correspond to respective tangent lines (only the tangent line 220, corresponding to the vector line 210, is shown in FIG. 2A, with the other two lines not shown) that are tangential to the circle representation 204 at the points of intersection between the various vectors and the circle representation 204. Although three pre-determined vector lines are shown, generally there will be more lines (each corresponding to a different tangent line) from which one of the tangent lines can be selected. For example, in some variations, 8, 16, 32, or any other number of lines may be used with the approaches and implementations described herein. As noted, in some implementations, other types of projection surfaces may be used.

With continued reference to the example of FIG. 2A, in the approaches described herein, the vector line that is closest in its direction to the direction defined by the sample z (or more particularly, by its line 202) is selected, and the tangent line corresponding to that vector line is selected as the line to which the clipping projection will be made. In some embodiments, the selection process may be based on a binary search. In the example of FIG. 2A, the vector line 210 (having a unit vector $\vec{a}=(\cos(\alpha), \sin(\alpha))$ is determined to have the closest direction to the direction defined for the line 202 associated with the sample z. Therefore, in this example, the line 220, associated with the line 210, is selected as the tangent line on which to project the sample z. The line 220 (line a) is perpendicular to the unit vector a and intersects that vector line at the distance ha from the point of origin of the complex plane of FIG. 2A.

The next operation is to project z onto the selected straight tangent line 220. This will yield us clipped sample z'. In situation in which the sample z resulted from first mapping an input sample to the first quadrant via rotation (flipping) operations, the determined projected sample z' needs to be reversed mapped based on a sequence that reverses the mapping (e.g., a sequence of three linear symmetries flips) that originally mapped the input sample to the sample z shown in FIG. 2A. In situations where no rotation was performed, the resultant projected sample z' is the output clipped sample for the input sample. Thus, in implementations in which the best of a plurality of vector lines is chosen, a clipping module (such as the clipping module 120) is configured to select the one of a plurality of different tangent lines according to a binary search performed to select a vector, $\vec{a}$, from a plurality of vectors, with an associated direction closest to a sample direction defined for the second complex-valued sample, with each of the plurality of vectors being associated with a respective vector direction computed according to $(\cos(\alpha_j), \sin(\alpha_j))$, where $\alpha_j$ is an angle defined between a point of origin of the complex-valued plane and a respective intersection point for the $j^{th}$ line of the plurality of tangent lines with the circle representation One of the parameters that needs to be chosen in the implementations described herein is the number of steps, S, to determine (e.g., via a binary search) the best (e.g., optimal or near-optimal) direction or angle. There is a trade-off consideration between complexity and precision. The rotate-and-project computational complexity is roughly (with some pseudo-multiplication assumptions, as will be discussed in greater detail below) CC≈14N+8SN (where N is number of bits used to represent a number, e.g., an integer number). This computational complexity compares favorably with the computational complexity for an ideal clipping procedure (i.e., projecting z to a circle) which is CC≈6N². Precision depends on the number of binary search steps. With zero (0) steps, a 20-30% deviation from optimal precision results is observed, while in a three-step search procedure that number goes down to the range of 2-5% (see FIGS. 7A-11B, and accompanying discussion, for further detail).

Another example implementation of the clipping approaches described herein is the rotate-and-project/tangent clipping implementation. This approach approximates a tangent of the phase of sample z, and is also referred to as the tangent-approximation power/clip computation (or TAPC). This implementation is similar to the implementation based on searching for vector lines that are the closest in their direction/orientation to the direction defined by the sample z, but with an important distinction. When performing the binary search, instead of performing angle dichotomy (i.e., comparing angles or vector directions), what is being performed is tangent dichotomy (i.e., comparing the tangent values associated with the sample z and the plurality of candidate tangent lines). Thus, in this example, determining the tangent line onto which the sample z is projected (in order to derive the clipped complex-valued sample) includes selecting the one of a plurality of different tangent lines according to a binary search performed to select a tangent value, from a plurality of tangent values, closest to a sample tangent value computed for the second complex-valued sample. Each of the plurality of tangent values corresponds to a tangent value, $\tan(\alpha_j)$, where $\alpha_j$ is an angle defined between a point of origin of the complex-valued plane and a respective intersection point for the $j^{th}$ line of the plurality of tangent lines with the circle representation.

Figure 2B:
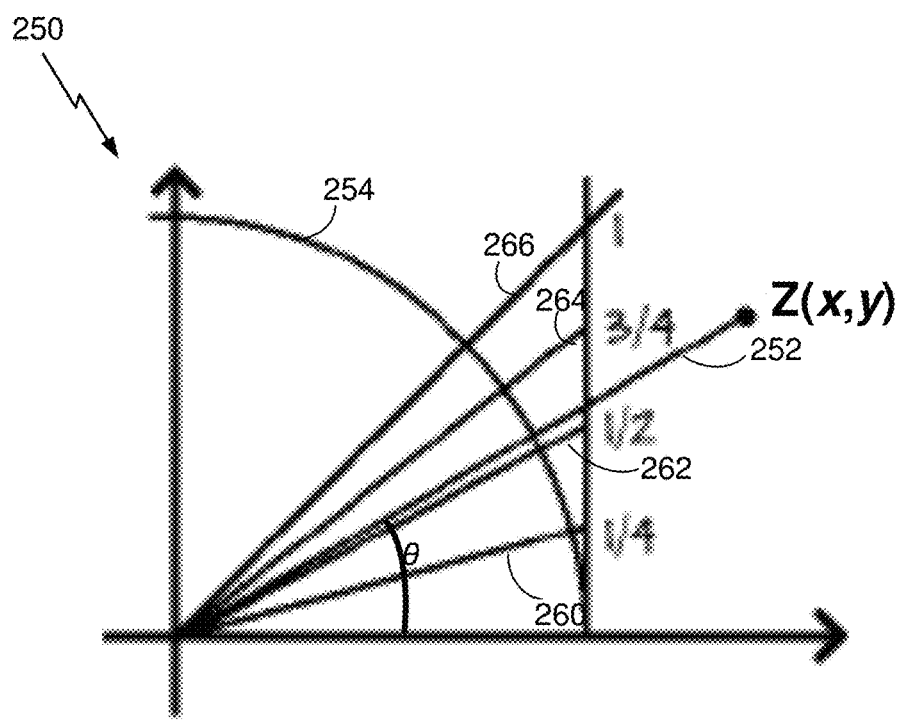

Consider the example illustration 250 shown in FIG. 2B. The sample z (corresponding to z=x+iy) is associated with a direction (defined by the line 252) forming an angle θ whose tangent is computed as y/x. This tangent value is compared with the tangent values (which may have been pre-computed) for pre-determined tangent lines. As noted, those tangent values may be defined as the tangents of the vectors lines formed by lines that pass from the point of origin of the complex plane to the point of intersection of the plurality of tangent lines (not shown in FIG. 2B) with the circle representation 254. In the example of FIG. 2B, four (4) tangent values (corresponding to 4 vector lines, which in turn correspond to 4 tangent lines) are illustrated, namely, 0.25 (corresponding to the line 260), 0.5 (corresponding to the line 262), 0.75 (corresponding to the line 264), and 1 (corresponding to the line 264, which has an angle, a of 45°). In the example of FIG. 2B, the closest pre-computed tangent value to the tangent value of the sample z is the tangent value 0.5 (corresponding to the line 262), and thus the tangent line associated with that value (that tangent line is perpendicular to the line 262, and is tangential to the circle representation 254) is selected as the tangent line on which to project z. The projection of z onto that selected tangent line results in a projection z' sample. If z was originally a mapping of an input sample through a sequence of flips onto the first quadrant, z' is reversed mapped in order to find the resultant complex-valued sample representing the optimal clip. If z is the original input sample, the resultant projection sample z' is the clipped value sought.

The tangent dichotomy implementation may, in some situation, be more computationally economical than the angle dichotomy implementation. Particularly, this implementation's computational complexity is roughly (again, assuming pseudo-multiplication with reasonable precision) CC≈10N+SN. The precision of this implementation is about the same as that of the angle dichotomy implementations.

As noted, some of the savings in the computational complexity are achieved from using pseudo multiplications to perform at least some of the operations of the approaches described herein. Quite often, in fixed-point code, for two numbers (e.g., x and a) that need to be multiplied, at least one of those number (e.g., a) may be known in advance. For example, the value a (e.g., such a value may be associated with one of the plurality of tangent lines on which the samples are to be projected) may be the value of $\cos(\pi/8)=0.923879532511286\ldots$ ). In this case, that value of a may be replaced by its short binary representation. For instance, if it is decided that no more than three binary fractions are to be used, then $\cos(\pi/8)\approx 1-\frac{1}{2}^4-\frac{1}{2}^6=0.921875$. If four binary fractions are to be used, then $\cos(\pi/8)\approx 1-\frac{1}{2}^4-\frac{1}{2}^6+\frac{1}{2}^9=0.923828125$. Thus, instead of computing the expression $x\cdot\cos(\pi/8)$ in fixed-point code with thirteen bits integers (e.g., $x\times 3784)>>12$), one of the following expressions can be used instead: $x-(x>>4)-(x>>6)$, or $x-(x>>4)-(x>>6)+(x>>9)$ (depending on the desired precision). Thus, computationally intensive multiplication operations can be replaced with simpler addition and subtraction operations. This approach is referred to as pseudo multiplication approach, and it can be used in conjunction with the clipping approaches described herein to reduce the computation complexity required for each sample (complex-valued sample) that is to be clipped. It is to be noted that some other small adjustment can further be made to improve the precision of the computational operations.

FIG. 3A provides an example code listing 310 of an example clipping procedure (also referred to as a TAPC-8 clipping procedure). The TAPC-8 procedure is a relatively short and simplified version of the rotate-and-project process in which the binary search for the best direction is skipped. In this example embodiments of the TAPC procedures, because the resultant polar angle of the flipped sample, z, is in the range of $[0, \pi/4]$, the value $\pi/8$ is selected as a "good enough" approximation for sample's polar angle direction.

FIG. 3B includes an example code listing 320 of a binary search process that can be added to the TAPC-8 clipping procedure (for which the sample code listing 310 is provided in FIG. 3A) to implement an AAPC-32 clipping procedure. It is to be noted that in the implementations corresponding to the code listings 310 and 320, the multiplication operations may be replaced by approximate pseudo-multiplications.

FIG. 3C includes an example code listing 330 to implement an example embodiment of a tangent-approximation power/clip computation clipping procedure referred to as the TAPC-32 clipping procedure. The code listing 330 includes a binary search portion 332, and a rotate portion 334 that implements improvements to the rotate-and-project operations (as discussed below). Additionally, the implementations realized by the example code listing 330 uses an order 4 pseudo-multiplication to replace cosine and sine values with sequences of four shift-adders.

The rotate-and-project portion 334 of the code listing 330 uses the following simple idea. First of all, when z is rotated by $-\alpha$ (where $\alpha$ is the "best" approximation for polar angle of z) by computing $z*\bar{a}(a=\cos(\alpha)+i\sin(\alpha))$, only the real part of the result is needed. The imaginary part of that number is ignored when the projection onto line $x=h$ (linear clipping) is performed. However, the imaginary part is needed when the result is rotated back (multiplying by a). Still, there is a way to avoid some intermediate multiplications. The following formulas show the three steps of the rotate-project approach.

$$z \to z_1 = z \times \bar{a}$$

$$z_1 \to z_2 = z_1 - \tau, t = \text{Re}(z_1) - h$$

$$z_2 \to z' = z_2 \times a$$

Thus, $z'=a(\bar{a}z-\tau)=z-\tau a$.

This shows that it is not necessary to compute $z_1$ and $z_2$. All that is needed is to compute $\tau$ (and for that only $\text{Re}(z_1)$ is needed). This allows reducing the clockwise rotation (e.g., four multiplications) by half (two multiplications), and then replacing the counter-clockwise rotation (again, four multiplications) by computing $z-\tau a$, which only involves two multiplications.

One other small advantage is that this allows saving one or even two adders when this code is used for the so-called soft-clipping (peak cancellation)—CFR implementations almost always require not the clipped value $z'$ but rather the clipping delta $z-z'$. Here, the clipping delta $z-z'=\tau a$ is computed before $z'$, which can be passed directly to CFR, while skipping $z'$ entirely. Furthermore, there is no need to tack on one more complex-valued adder that computes $z-z'$ after the clipping function returns.

One potential disadvantage of the TAPC approach is the necessity of multiplication by an unknown (in advance) number $a=(\cos(\alpha), \sin(\alpha))$. While the angle $\alpha$ itself belongs to a relatively small set of values (e.g., size eight for TAPC-32), this multiplication may be still more complex than the scaling done in CORDIC. However, performance of, say, TAPC-16 (or TAPC[2], with two dichotomy steps) is about the same as for CORDIC-S-32 (CORDIC-S[3], with three dichotomy steps) while in their approximate computational complexity TAPC[2] now has a slight advantage. Another possible advantage for TAPC is in FPGA where having a few relatively small look-up tables for sine/cosine values adds virtually nothing to the area resource size.

In some embodiments of the clipping implementations described herein, the TAPC/AAPC approach can also be used for direct power (vector length) computation which is quite similar to clipping. FIG. 3D includes an example code listing 340 of a simple code implementation utilizing the TAPC[3] approach.

Figure 4:
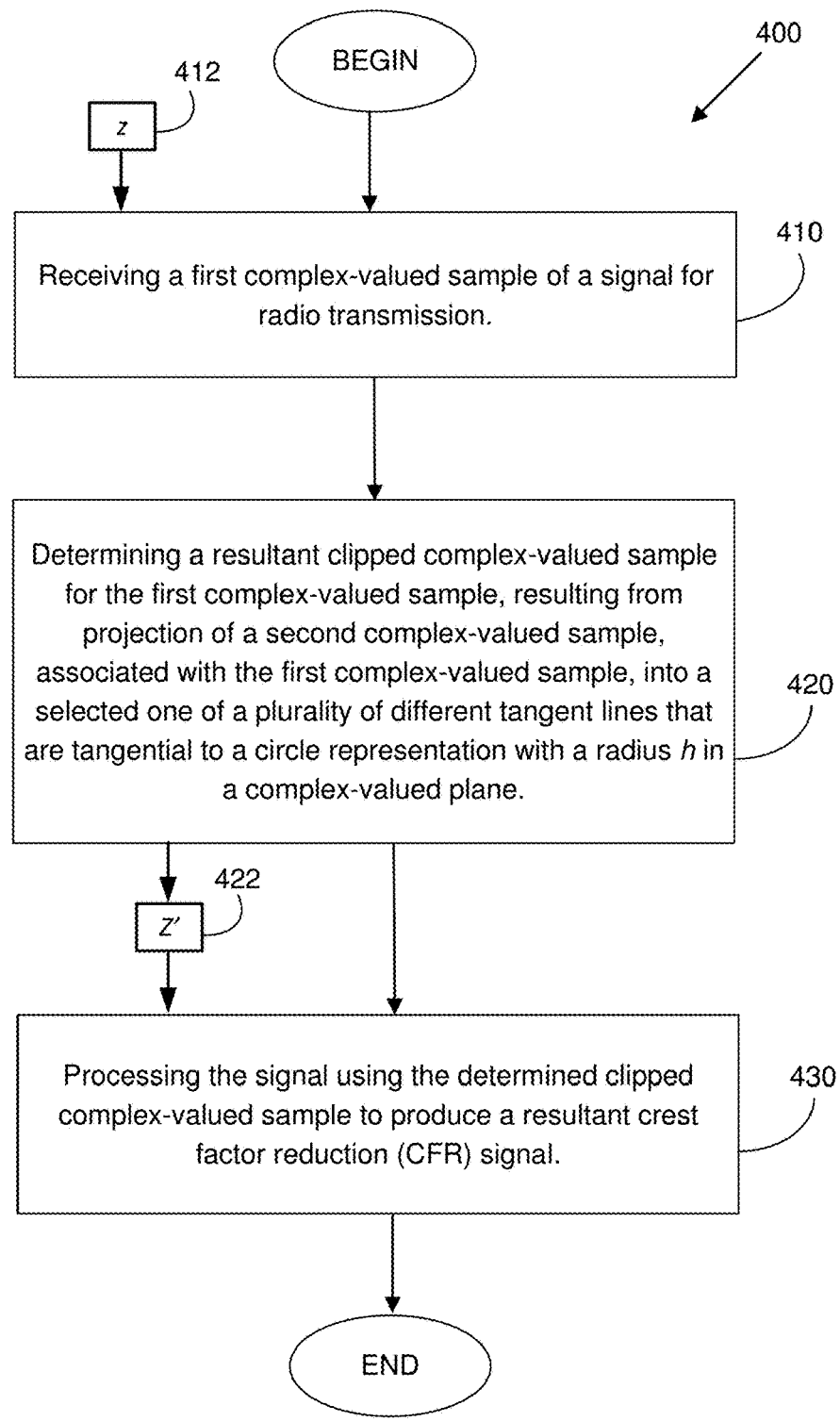
FIG. 4 is a flowchart of an example procedure to perform CFR processing.

With reference next to FIG. 4, a flowchart of an example procedure 400 for crest factor reduction (CFR) processing is shown. The procedure 400 includes receiving 410 a first complex-valued sample (e.g., the sample z, marked as data sample 412) of a signal for radio transmission, and determining 420 a resultant clipped complex-valued sample $z'$ (e.g., the sample 422 illustrated in FIG. 4) for the first complex-valued sample, resulting from projection of a second complex-valued sample, associated with the first complex-valued sample, into a selected one of a plurality of different tangent lines that are tangential to a circle representation with a radius h in a complex-valued plane. The procedure 400 further includes processing 430 the signal using the determined clipped complex-valued sample to produce a resultant CFR signal. In some examples, h may represent the magnitude of a complex-valued clipping threshold.

In some embodiments, determining the clipped complex-valued sample may include mapping, using a sequence of mapping operations (e.g., flipping/rotating operations), the first complex-valued sample to the associated second complex-valued sample located in a mapped region of the complex-valued plane, selecting an optimal line from the plurality of different tangent lines, projecting the second complex-valued sample to the optimal line selected from the plurality of different tangent lines, and applying a reverse-mapping sequence, based on the sequence of mapping operations, to compute the clipped complex-valued sample. The mapped region may be a bisector region of a first quadrant of an x-y plane satisfying the constraints $x \geq 0$, $y \geq 0$, and $x \geq y$. Alternatively, in some embodiments, the rotation operations may not be performed, in which case, the second complex-valued sample is the first complex-valued sample.

In some examples, determining the clipped complex-valued sample may include selecting the one of the plurality of different tangent lines according to a vector, $\vec{a}$ (e.g., selected according to a binary search or some other type of search or procedure), from a plurality of vectors, with an associated direction closest to a sample direction defined for the second complex-valued sample, with each of the plurality of vectors being associated with a respective vector direction computed according to $(\cos(\alpha_j), \sin(\alpha_j))$, and with $\alpha_j$ being an angle defined between a point of origin of the complex-valued plane and a respective intersection point for the $j^{th}$ line of the plurality of tangent lines with the circle representation. In some embodiments, determining the clipped complex-valued sample may include selecting the one of the plurality of different tangent lines according to a tangent value, selected from a plurality of tangent values, closest to a sample tangent value computed for the second complex-valued sample, with each of the plurality of tangent values corresponding to a tangent value, $\tan(\alpha_j)$, and with $\alpha_j$ being an angle defined between a point of origin of the complex-valued plane and a respective intersection point for the $j^{th}$ line of the plurality of tangent lines with the circle representation. Selecting the one of the plurality of different tangent lines may include selecting the one of the plurality of different tangent lines according to a binary search performed to select the tangent value, from the plurality of tangent values, closest to the sample tangent value computed for the second complex-valued sample. Selection of the tangent value may be performed according to some other type of search, or some other procedure.

In some situations, at least some of the plurality of different tangent lines may be defined in pre-determined orientations such that determination of the (optimal or near-optimal) clipped complex-valued sample is computed, at least in part, based on pseudo-multiplication operations that reduce the number of actual multiplication operations required to determine the clipped complex-valued sample.

To test and evaluate the performance of the clipping procedures described herein, several simulations and experiments were conducted to compare performance results of various clipping procedures/processes with performance results of the proposed clipping implementations described herein. The legacy clipping procedures against whose performance the clipping implementations proposed herein were compared included the ideal clipping process, the octagon clipping procedure, and two types of CORDIC clipping procedures. As noted above, the ideal clipping is defined as $$z' = f(z, h); f(z, h) = z \frac{h}{|z|} = z \frac{h}{\sqrt{x^2 + y^2}}$$

In the ideal clipping implementation, precision is "ideal", meaning that in a fixed-point test, there would be zero deviation from the best possible answer. Of course, this is a very expensive method, because implementing both square root and division in fixed-point arithmetic is very costly. However, double multiplication can be replaced by approximate pseudo-multiplication, and some simplifying processes for division and square root can be employed. FIG. 5A includes an example code listing 510 of an example ideal clipping procedure. The code listing 510 includes the header portion 512 which is shared by the code listings 520 and 530 provided in FIGS. 5B-C. In the code listing 510, the code lines marked with the notation '[*]' consume most of the computation complexity as well as the hardware resources (chip area). Code lines marked with the notation '[**]' also consume substantial computing resources due to the execution of the division operation upw. The challenge in implementing clipping procedures is to avoid expensive functions.

Figure 6A:
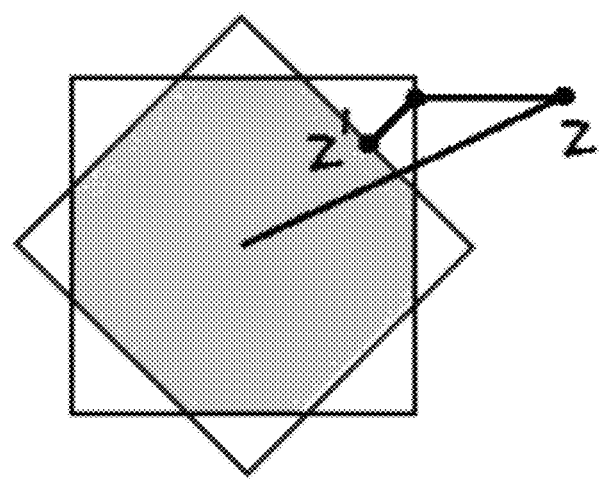
FIG. 6A is a diagram illustrating the octagon clipping procedure.

Another clipping procedure is the octagon clipping. In this implementation, this function is a superposition of two square-clipping functions. First, a unit square-clipping procedure is performed (in the latter procedure, the clipping function $f(z,h)$ is defined $(g(\text{Re}(z), h), g(\text{Im}(z),h))$, and $g(x,h)$=if $(x>0)$ min(x,h); else max(x, -h). The operations using the unit square are then repeated with the unit square rotated by 45 degrees. FIG. 6A provides a diagram 610 illustrating the octagon clipping procedure. The octagon clipping's computational complexity is low, but its precision (efficiency) is also relatively low. In some tests, the clipping results using the octagon method were observed to have as much as 30-60 percent deviation from the exact answer. FIG. 5B includes an example code listing 520 for an example octagon clipping procedure. The main disadvantage of octagon clipping is the significant phase damage done by the very first step of the procedure (square clipping). This procedure is not symmetric with respect to its two main steps, which is another factor contributing to its relatively low precision.

Yet a further legacy clipping methodology that was used in the tests and evaluations to assess the performance of the implementations described herein is the CORDIC/tangent clipping procedure. This procedure employs a version of binary search which could be described as a "convergence" approach. Specifically, at each step k, an angle $\alpha_k$ is added or subtracted whose amplitude is approximately half of the previous angle $\alpha_{k-1}$. In standard fixed-point implementation of CORDIC procedure, these angles are chosen in accordance with formula $\alpha_k=\arctan(\frac{1}{2}^k)$, k=1, 2, . . . , S. At the $k^{th}$ step the sample z=(x,y) is rotated by either $\alpha_k$ or $-\alpha_k$ depending on the sign of y. Since in the end the rotated image of z is supposed to be quite close to X-axis, it can assume that the clipped value will be a point c=(h, 0). Thus, at each rotation step, c can be counter-rotated by the same angle with different sign. The inequality $\alpha_{k+1}>\alpha_k/2$ ensures convergence to the "ideal" solution; the issue here, though, is the efficiency, that is, precision versus number of rotation steps.

Figure 6B:
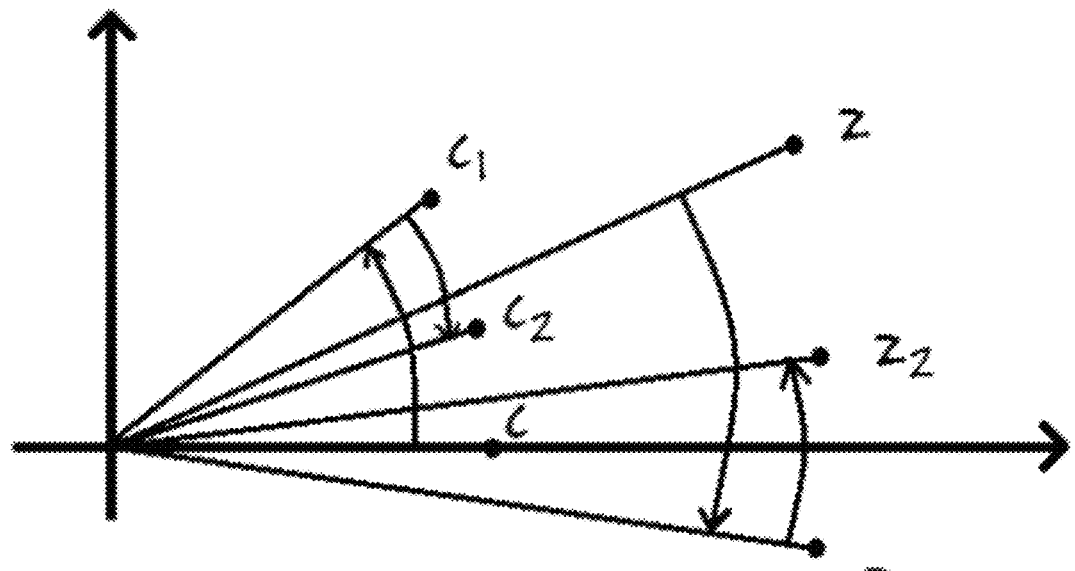
FIG. 6B is a diagram illustrating two steps performed as part of the CORDIC/tangent clipping approach.

FIG. 6B includes a diagram 620 illustrating two steps performed as part of the CORDIC/tangent clipping approach. In the first step, the complex sample z is rotated clockwise to the point $z_1$ by an angle $\alpha$, and the sample $z_1$ is subsequently rotated counterclockwise, by an angle $\alpha/2$ to the point $z_2$. For the CORDIC/tangent clipping approach, the number of the binary search steps should be kept relatively large for the sake of precision. Clearly, precision for CORDIC varies based on the value of S. However, there is another consideration. If rotation and counter-rotation cycles are separated, then the achieved precision is about the same as for the octagon approach. If they are merged and the counter-rotation cycle is not "waiting" for the more precise clipped value then the precision is noticeably worse and improves only with significant increase in the number of rotation steps.

FIG. 5C includes an example code listing 530 for an example CORDIC-S 32 clipping procedure. The procedure realized by the code listing 530 includes a "flip" steps (e.g., to reduce the locus of z to the lower half of the first quadrant of the coordinate plane doing one such flip is cheaper than performing an extra binary search step), followed by a rotation cycle, a clip, and counter rotation cycle. In some examples, some improvements can be made to the code listing 530 (e.g., based on the fact that the first rotation is always done in the clockwise direction).

It is to be noted that the rotations are done using $\tan(\alpha_k)$, not $\cos(\alpha_k)$ and $\sin(\alpha_k)$. This can significantly simplify the computation, but will require scaling both the threshold and the clipped value. However, since the total scaling factor is known in advance (based on the number of rotation steps), the scale-back operation can be performed relatively cheaply, using pseudo multiplications. Another approach is, knowing the scaling coefficient, to pass all necessary scaled thresholds to the function as pre-computed arguments. One issue that arises for this clipping approach here is in the optimization of the rotation/counter-rotation cycle. If there is a wait for the rotation cycle to end in order to produce a better clipping result—that is, point (h, y) rather than point (h, 0)—then the rotation and counter-rotation cycles need to be separated. If there is no wait for the better clipped value, but counter-rotations are performed immediately (e.g., starting with point (h, 0)), then the precision of the procedure drops quite noticeably. Improving it requires significant increase in the number of rotations (e.g., binary search) steps. However, that would allow merging the rotation and counter-rotation into one cycle with some parallelization advantages together with small savings in complexity and memory usage. FIG. 5D includes an example code listing 540 implementing a CORDIC-P 32 clipping procedure in which rotation and counter-rotation operations are done in parallel.

Having defined some of the other approaches against which the performances of the implementations proposed herein will be compared, several simulations, evaluations, and experimentations were conducted to compare the performances of the different clipping approaches. The various tests that were performed controlled not only the signal characteristics/configurations, but also the complexity parameters for some of the clipping approaches (the rotate-and project/angle, the rotate-and-project/tangent, and the CORDIC clipping approaches). For example, for some of the tests/experiments, the number of binary search steps implemented for some of the clipping approaches was varied.

In establishing the testing/evaluation framework, several issues (and affected parameters) were considered. These included: a) the appropriate bit-rate to use, b) how much precision can be sacrificed to reduce computational complexity, c) the appropriate framework for performance evaluation of the various clipping approaches. In the embodiments described herein, clipping was used as a part of larger system/process, namely, crest-factor reduction (CFR). Thus, an example evaluation framework (testbench) may be the following: a) use a positive integer N (corresponding to the signal bitrate; usually lies in the range between 10 and 20), b) use a digital signal u represented as a sufficiently long array of complex numbers (each one with a pair of N-bit signed integers); the type of the signal is determined by the specific application (e.g., LTE 20 MHz test signal with sampling rate of 245.76 MHz), c) Positive N-bit integer h representative of a clipping threshold, d) simple low-pass filtering which will be used to clean the signal's spectrum mask, e) positive (small) integer numSteps, corresponding to the number of clip-and-filter steps (stages), and f) Boolean value hardClip value which determines whether one last clipping step (without subsequent filtering) is performed. Finally, some (different from ideal) clipping function $f(z, h): \mathbb{C} \to \mathbb{C}$.

In the various testing/evaluations performed for the approaches described herein, the value chosen for N was N=13. Additionally, a relatively short (with only 27 taps) low-pass filter was chosen. The test signal length was selected to be 10,000, the number of clip-and-filter stages was set to numSteps=2, with the hardClip parameter set to hardClip=true. With those selected values, the testbench was configured to process the signal u as follows: a) The following two steps were executed numSteps times—(i) each sample is clipped using the function $f(z, h)$, and (ii) the resulting signal is filtered, b) If hardClip=true then the output signal is clipped one last time, c) for the final resulting signal, v, three characteristics were computed: cfr(v), evm(u, v), and acpr(v). Compiling table of values for these three functions for different clipping approaches/processes allows conducting of a complexity versus performance analysis of the approaches under consideration.

Figure 7A:
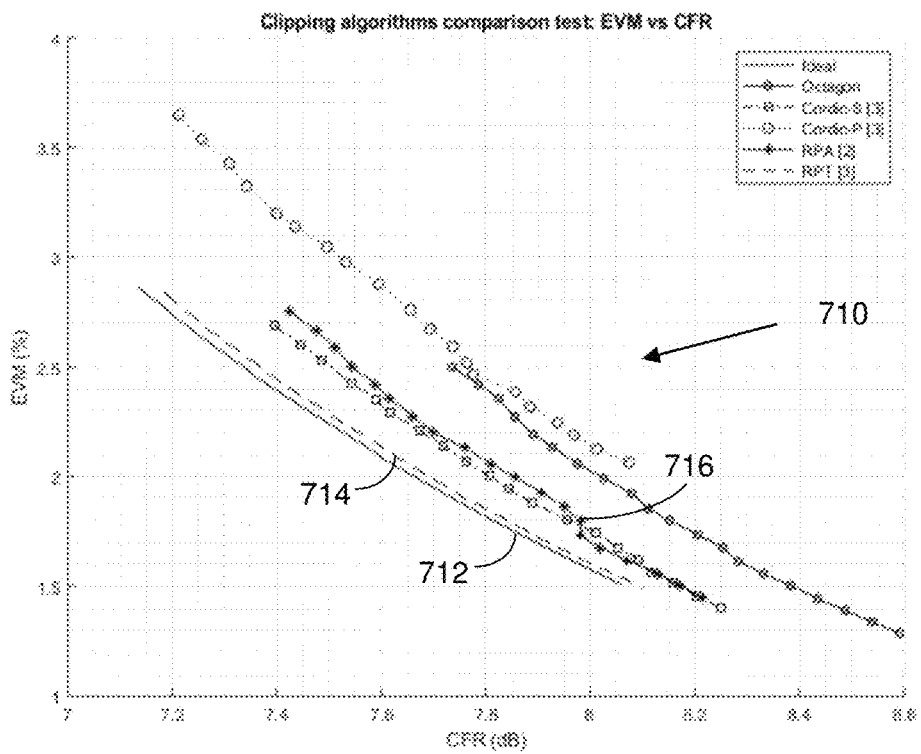
FIGS. 7A-B are graphs comparing performance results for various clipping approaches in a first testing configuration.
Figure 7B:
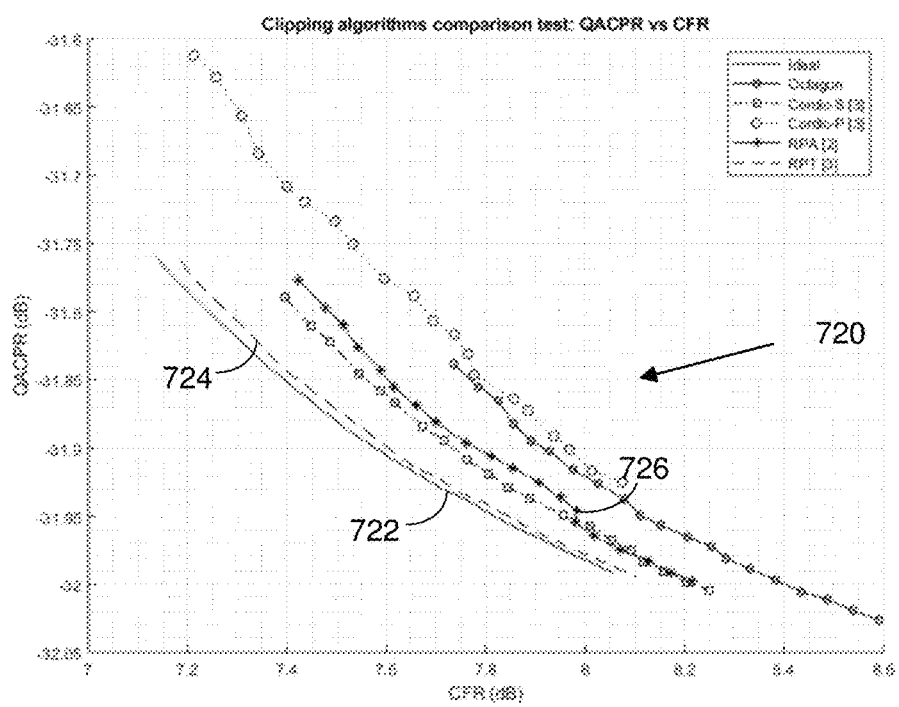

Thus, in a first testing/evaluation configuration, a test signal was used that aggregated four 5 MHz LTE basic signals according to asymmetric spectrum mask of a total width of 145 MHz (with a sampling rate of 491.52 MHz). FIGS. 7A and 7B are graphs 710 and 720 showing performance of the various clipping approaches. Particularly, FIG. 7A provides plots of the EVM (error vector magnitude, which, as noted, is defined as the square root of the mean error power divided by the square root of a reference power, e.g., the maximum power of the coding constellation) versus CFR for the various clipping approaches. FIG. 7B provides plots of ACPR (adjacent channel power ratio, which, as noted, is defined as a ratio between the total power in adjacent channels (e.g., an intermodulation signal) to the desired channel's power) versus CFR for the various clipping approaches. As can be seen from the plots in the graphs 710 and 720, while the best performance is achieved, as expected, by the ideal clipping approach (curves 712 and 722, respectively), the best performing clipping approach for the first evaluation configuration is the rotate-and-project/ tangent (RPT) approach (curves 714 and 724), with the rotate-and-project/angle (RTA) approach (curves 716 and 726) performing slightly worse than the RPT approach, but closely matching the CORDIC-P approach.

Figure 8A:
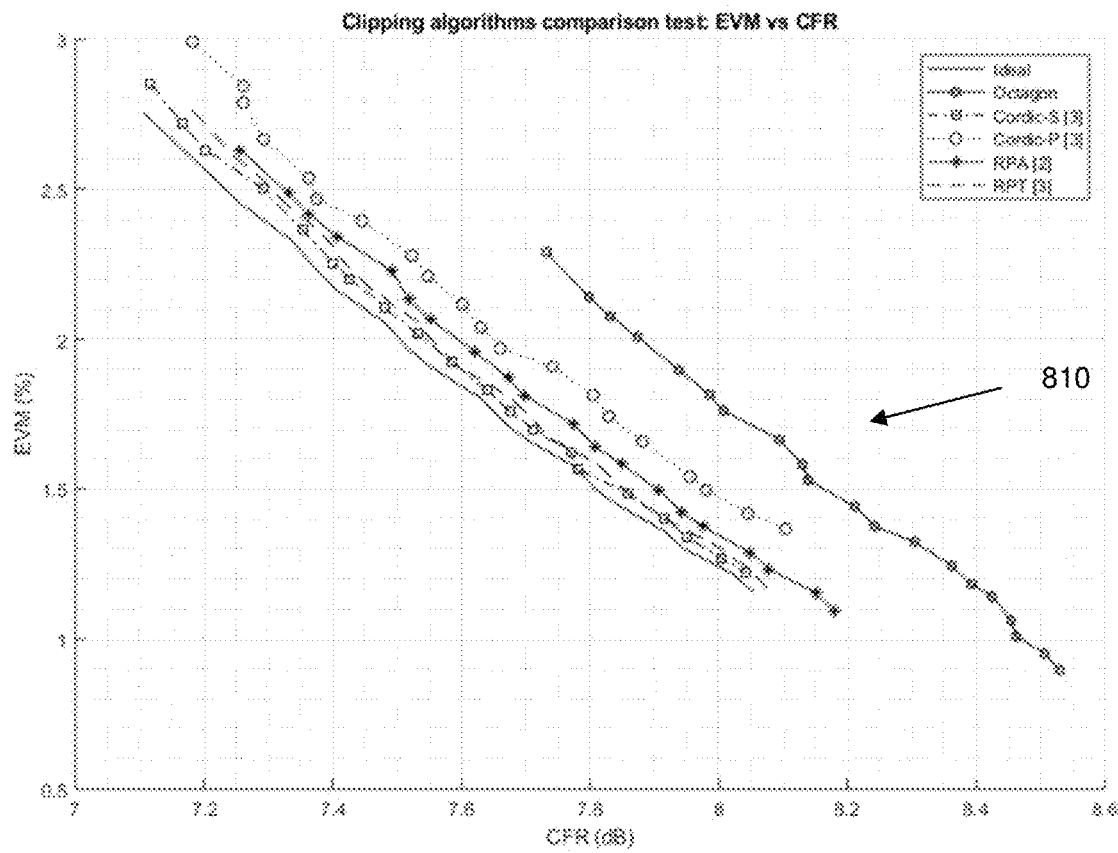
FIGS. 8A-B are graphs comparing performance results for various clipping approaches in a second testing configuration.
Figure 8B:
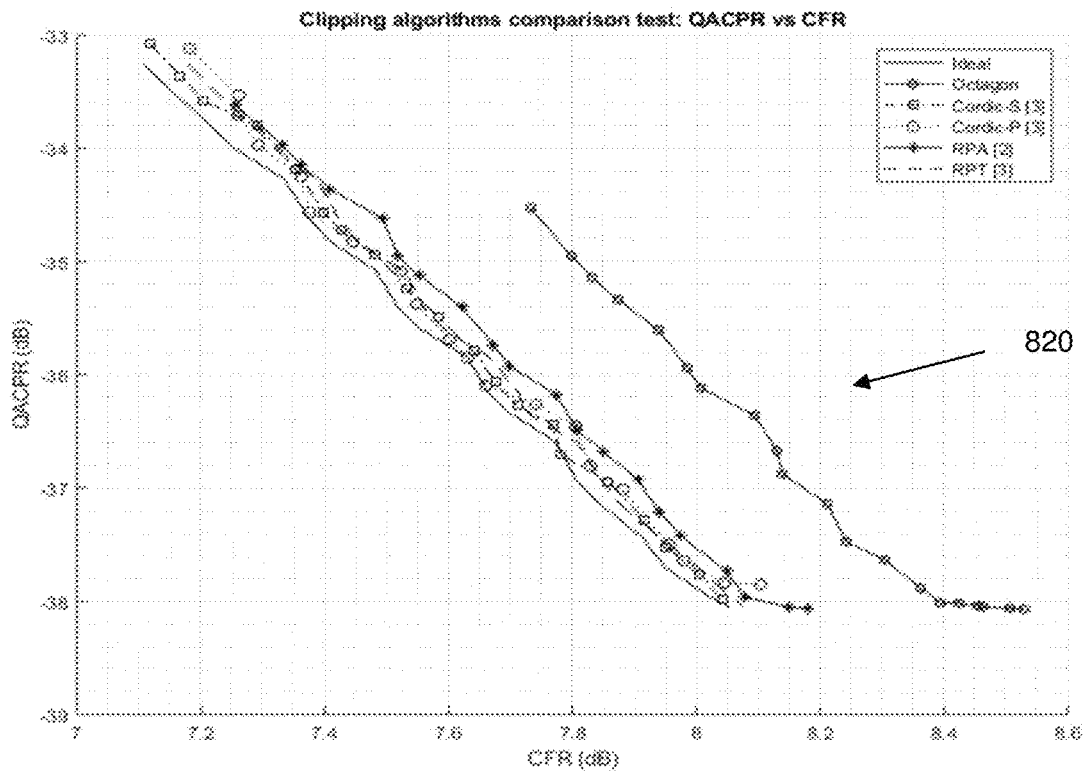
Figure 9A:
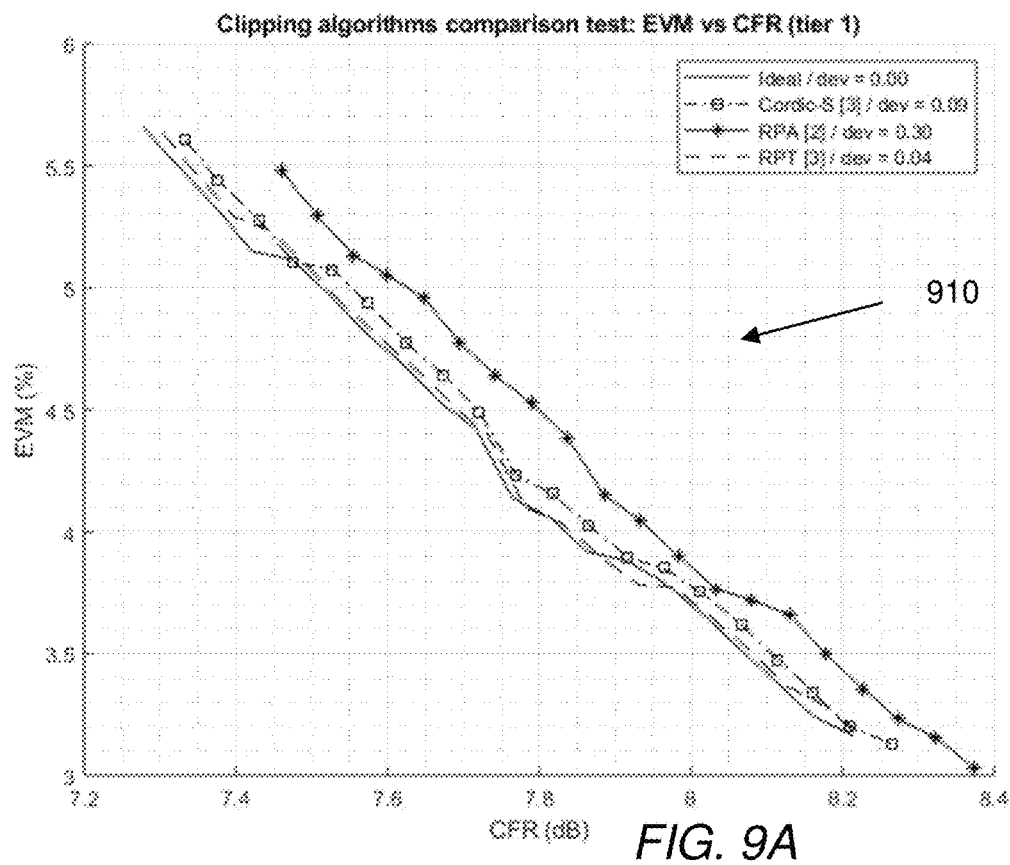
FIGS. 9A-D are graphs comparing performance results for various clipping approaches in a third testing configuration.
Figure 9B:
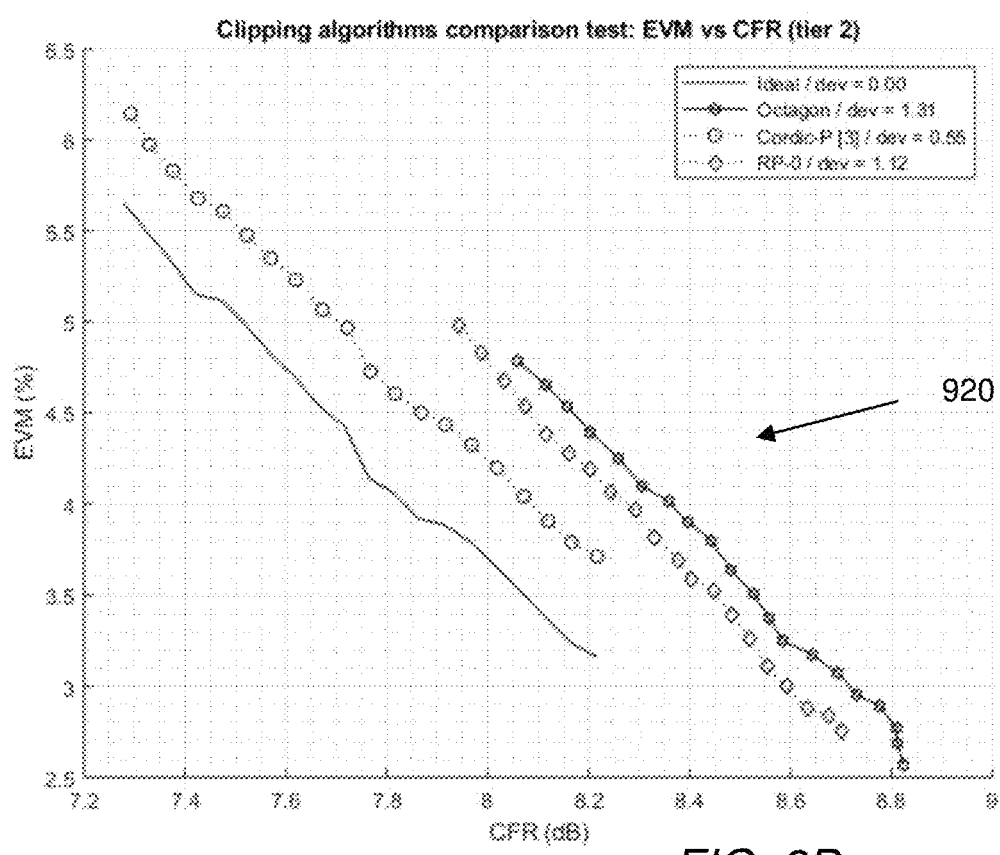
Figure 9C:
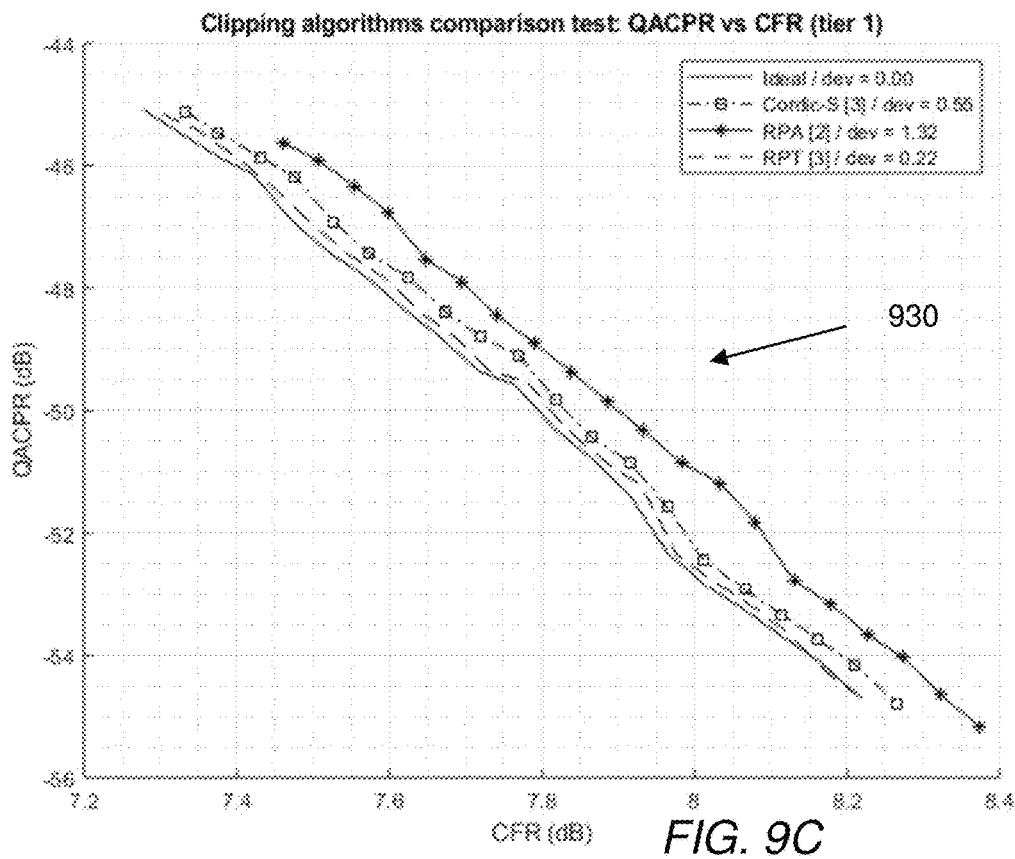
Figure 9D:
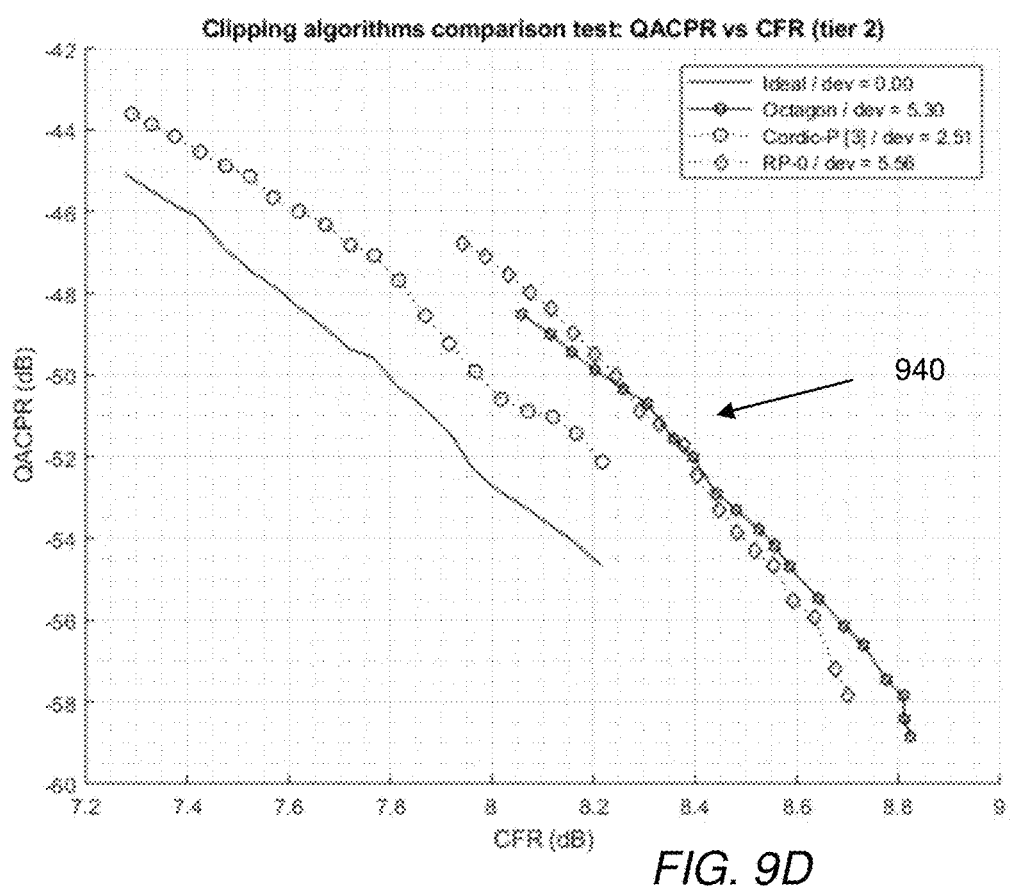

FIGS. 8A and 8B are graphs showing performance results using a second evaluation/testing configuration, in which a test signal was obtained by aggregating two 20 MHz LTE basic signals according to asymmetric spectrum mask of a total width of 125 MHz, with a sampling rate of 491.52 MHz. More particularly, FIG. 8A includes a graph 810 with plots of EVM versus CFR for various tested clipping approaches, while FIG. 8B includes a graph 820 with plots of ACPR versus CFR for the various clipping approaches.

In a third testing configuration, the performances for seven different clipping approaches were tested and compared. The seven clipping approaches included the rotate-and-project/angle and rotate-and-project/tangent approaches discussed herein, as well as the ideal approach, the octagon approach, the CORDIC-S approach, the CORDIC-P approach, and a rotate-and-project approach that skips the binary search process (i.e., the TAPC-8 approach discussed with respect to the code listing 310 of FIG. 3A). In the third testing configuration, the test signal used was obtained by aggregating 10, 20, 20, 20 and 5 MHz LTE basic signals with centers selected almost at random at −81, −63 −22, 38 and 101 MHz in the base-band, and with a sampling rate of 491.52 MHz. The approaches were divided into two groups/tiers (based on results from the various evaluation configurations). The first tier included the approaches with performance equal to or close to the ideal (namely, the ideal approach, the CORDIC-S, AAPC (i.e., rotate-and-project/ angle), and the TAPC approach (i.e., rotate-and-project/ tangent). The second tier includes the ideal clipping approach (for reference) and three other approaches (octagon, CORDIC-P and TAPC[0], whose performance numbers were noticeably worse. The performance results for the seven clipping approaches are illustrated in FIGS. 9A-9D, which include graphs showing performance results using the third evaluation/testing configuration. Particularly, FIG. 9A includes a graph 910 with plots of EVM versus CFR for the tier 1 clipping approaches, FIG. 9B includes a graph 920 with plots of EVM versus CFR for the tier 2 clipping approaches, FIG. 9C includes a graph 930 with plots of ACPR versus CFR for the tier 1 approaches, and FIG. 9D includes a graph 940 with plots of ACPR versus CFR for the tier 2 approaches. To facilitate comparison and analysis of the performance results for the various clipping approaches represented by the various plots/curves, each of FIGS. 9A-9D also includes, in the plot legend for the figures, the average deviation of the respective performance results from the performance result for the ideal curve. The average deviations were computed through determination of the best linear fit for each plot, followed by evaluating that determined best linear fit at a test point (in the examples of FIGS. 9A-D, the test point was 7.5 dB for the first tier approaches, and 8.0 dB for the second tier approaches).

Figure 10A:
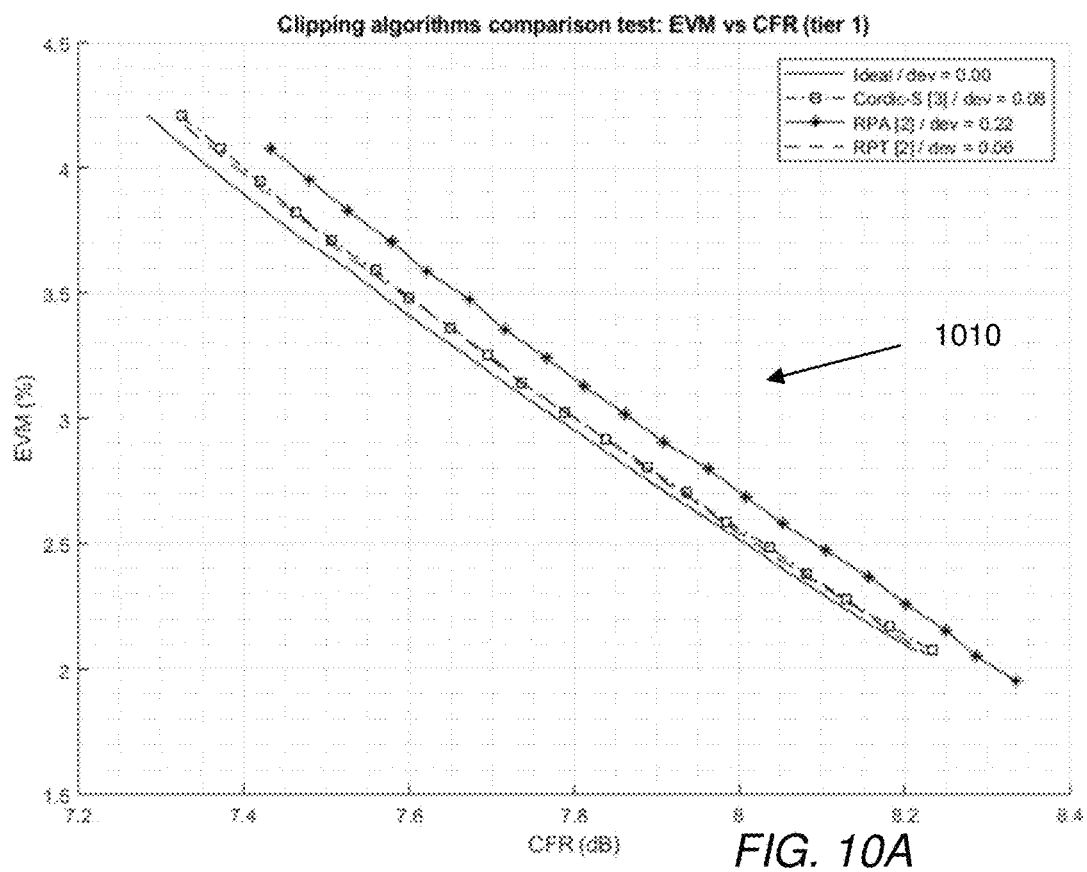
FIGS. 10A-B are graphs comparing performance results for various clipping approaches in a fourth testing configuration.
Figure 10B:
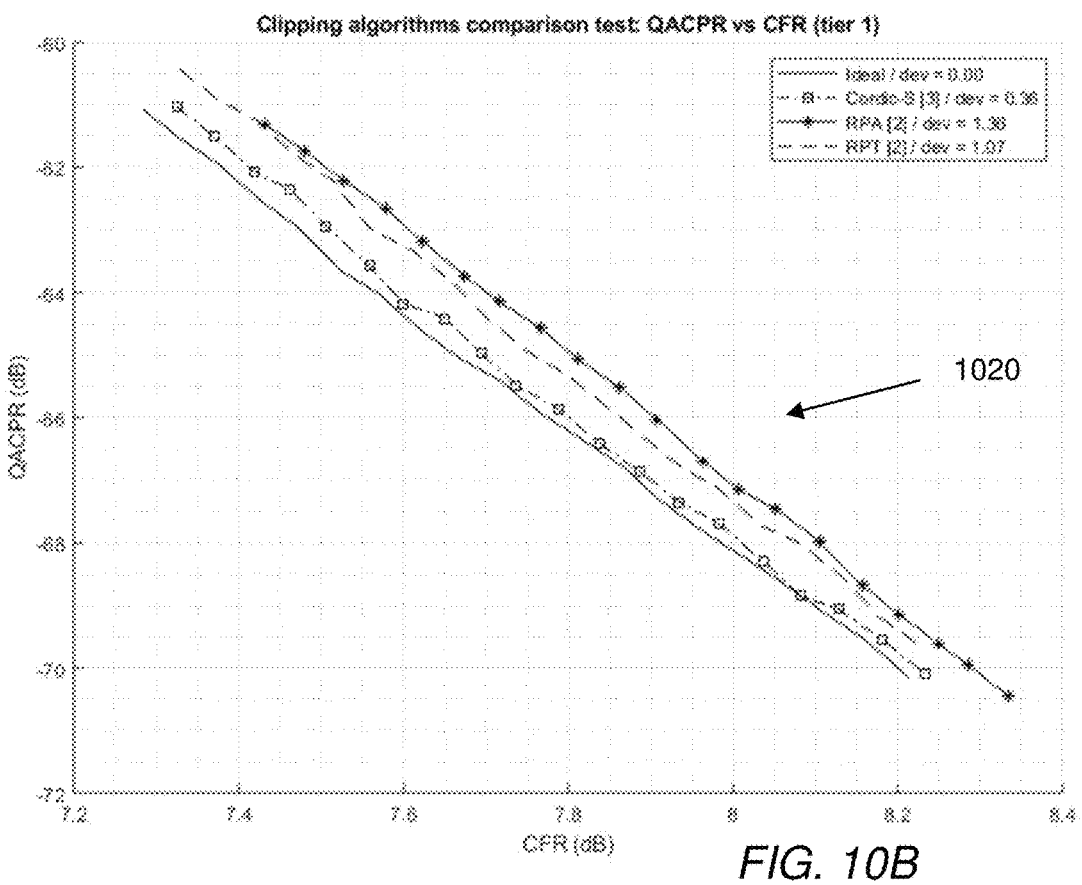

FIGS. 10A and 10B are graphs showing performance results using a fourth evaluation/testing configuration that was used for first tier clipping approaches. In this experimentation, the implementations of the clipping approaches tested corresponded to realizations with low computational complexity (represented by area footprint). The clipping approaches tested included the ideal approach (as the reference approach), CORDIC-S (implemented with a 3-step binary search), rotate-and-project/angle approach (implemented with a 2-step binary search), and rotate-and-project/ tangent approach (implemented with a 2-step binary search). The fourth testing configuration used two 5 MHz carriers at the edge of a wide mask (with centers at −115 and +110 MHz), and with a sampling rate of 491.52 MHz. FIG. 10A includes a graph 1010 with plots of EVM versus CFR for the tier 1 clipping approaches tested, while FIG. 10B includes a graph 1020 with plots of ACPR versus CFR for the various first tier clipping approaches tested. As with FIGS. 9A-D, here too the average deviation of the performance results (from the results for the ideal approach) for the various tested clipping approach was indicated in the plot legend for each figure.

Figure 11A:
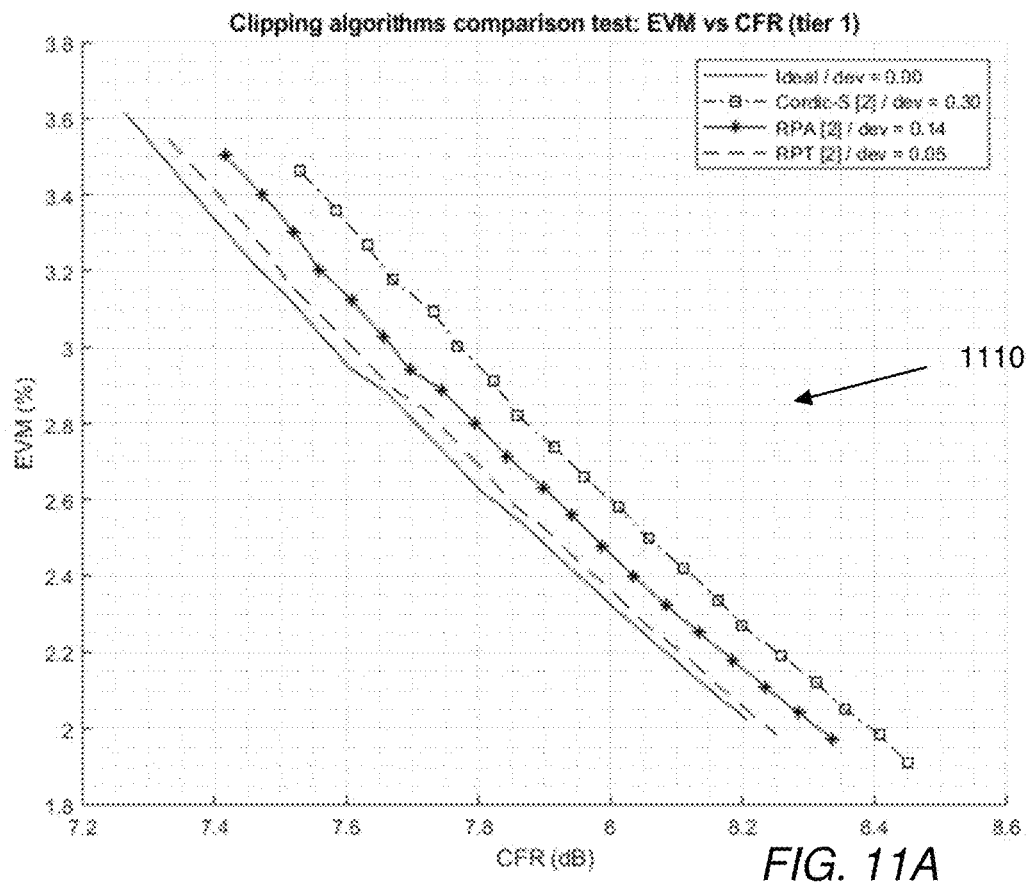
FIGS. 11A-B are graphs comparing performance results for various clipping approaches in a fifth testing configuration.
Figure 11B:
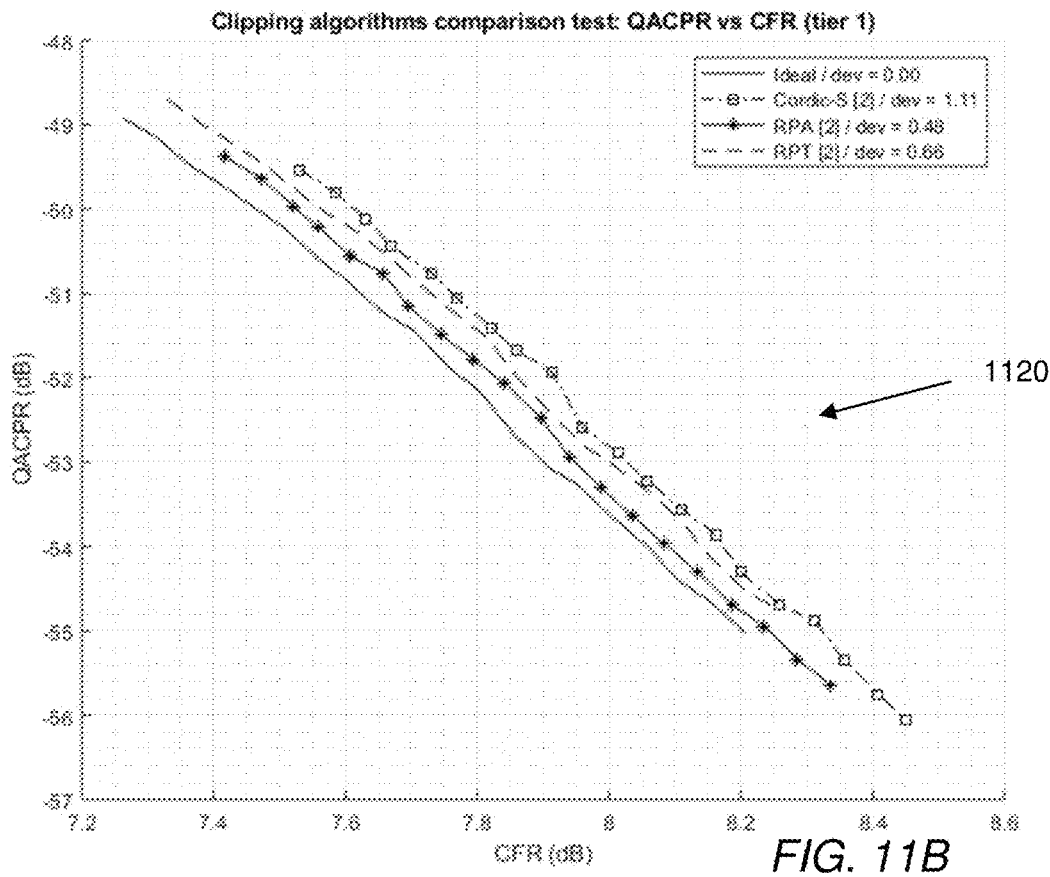

FIGS. 11A and 11B are graphs showing performance results using a fifth evaluation/testing configuration that was used for first tier clipping approaches. The clipping approaches tested included the ideal approach (as the reference approach), CORDIC-S (implemented with a 2-step binary search), rotate-and-project/angle approach (implemented with a 2-step binary search), and rotate-and-project/ tangent approach (implemented with a 2-step binary search). The fifth testing configuration used two 20 MHz carriers at the edge of a wide mask (with centers at −105 and +102 MHz), and with a sampling rate of 491.52 MHz. FIG. 11A includes a graph 1110 with plots of EVM versus CFR for the tier 1 clipping approaches tested, while FIG. 11B includes a graph 1120 with plots of ACPR versus CFR for the various first tier clipping approaches tested. As with FIGS. 10A-B, the average deviation of the performance results (from the results for the ideal approach) for the various tested clipping approach is indicated in the plot legend for each figure.

Table 1, below, provides the computational complexity for the various approaches discussed in relation to the performance result evaluations of FIGS. 7A-11B. The computational complexity is expressed below in terms of the estimated die area for the implemented approaches.

TABLE 1

| Clipping Approach | Estimated Die Area |
|---|---|
| Ideal | 5000 |
| Octagon | 275 |
| Rotate-and-Project/Tangent (no binary search) | 285 |
| CORDIC-S (2-step binary search) | 450 |
| CORDIC-S (3-step binary search) | 650 |
| CORDIC-P (2-step binary search) | 600 |
| CORDIC-P (3-step binary search) | 800 |
| Rotate-and-Project/Angle (3-step binary search) | 1100 |
| Rotate-and-Project/Tangent (2-step binary search) | 575 |
| Rotate-and-Project/Tangent (3-step binary search) | 678 |

Tables 2-5, below, provide summaries of the performance results obtained from the various experiments discussed in relation to FIGS. 7A-11B above. Tables 2 and 3 summarize performance results for first tier clipping approaches, while Tables 4 and 5 summarize the performance results for second tier clipping approaches. The CORDIC approach implemented for the third and fourth testing configurations used three rotation steps, while the CORDIC approach implemented for the fifth testing configuration used two (2) rotation steps. The rotate-and-project approaches (angle and tangent) implemented for the third testing configuration used one binary search step, while the rotate-and-project approaches implemented for the fourth and fifth testing configuration used two (2) binary search steps.

TABLE 2

Tier 1, EVM: Deviation from Ideal (%)

| Test | CORDIC-S | Rotate-and-Project/Angle | Rotate-and-Project/Tangent |
|---|---|---|---|
| 3 | 0.11 | −3.41 | 0.50 |
| 4 | 0.08 | 0.22 | 0.06 |
| 5 | 0.30 | 0.14 | 0.05 |

TABLE 3

Tier 1, ACPR: Deviation from Ideal (dB)

| Test | CORDIC-S | Rotate-and-Project/Angle | Rotate-and-Project/Tangent |
|---|---|---|---|
| 3 | 0.33 | 11.0 | 2.97 |
| 4 | 0.36 | 1.36 | 1.07 |
| 5 | 1.11 | 0.48 | 0.66 |

TABLE 4

Tier 2, EVM: Deviation from Ideal (%)

| Test | Octagon | CORDIC-P | Rotate-and-Project/Tangent (no binary search) |
|---|---|---|---|
| 3 | 1.31 | 0.55 | 1.12 |
| 4 | 0.55 | 0.22 | 0.49 |
| 5 | 0.65 | 0.96 | 0.69 |

TABLE 5

Tier 2, ACPR: Deviation from Ideal (dB)

| Test | Octagon | CORDIC-P | Rotate-and-Project/Tangent (no binary search) |
|---|---|---|---|
| 3 | 5.30 | 2.51 | 5.56 |
| 4 | 0.28 | 4.90 | 1.25 |
| 5 | 2.88 | 4.46 | 2.66 |

Thus, as shown by the various performance results (illustrated in FIGS. 7A-11B), and the result summaries in Tables 1-5, the best performance results are, not surprisingly, achieved by the ideal clipping approach. However, these performance results come at an extremely high computational effort, with the ideal clipping approach requiring almost five (5) times the die area required for the next ranked computational-effort approach (rotate-and-project/angle, has a die area, as indicated by Table 1, of 1100, compared to the 5000 value indicated for the ideal clipping approach). However, as illustrated in the graphs of FIGS. 7A-11B, the rotate-and-project/tangent and rotate-and-project/angle clipping approaches achieve performance results that are close to the performance results achieved by the ideal clipping approach, but at a more efficient computational cost.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limit the scope of the invention, which is defined by the scope of the appended claims. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method for crest factor reduction (CFR) processing comprising:
   receiving a first complex-valued sample of a signal for radio transmission;
   determining a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane; and
   processing the signal using the determined clipped complex-valued sample to produce a resultant CFR signal.

2. The method of claim 1, wherein determining the resultant clipped complex-valued sample comprises:
   mapping, using a sequence of mapping operations, the first complex-valued sample to the associated second complex-valued sample located in a mapped region of the complex-valued plane;
   selecting an optimal line from the plurality of different tangent lines;
   projecting the second complex-valued sample to the optimal line selected from the plurality of different tangent lines; and
   applying a reverse-mapping sequence, based on the sequence of mapping operations, to compute the clipped complex-valued sample.

3. The method of claim 2, wherein the mapped region is a bisector region of a first quadrant of an x-y plane satisfying the constraints x≥0, y≥0, and x≥y.

4. The method of claim 1, wherein determining the clipped complex-valued sample comprises:
   selecting the one of the plurality of different tangent lines according to a binary search performed to select a vector, $\vec{a}$, from a plurality of vectors, with an associated direction closest to a sample direction defined for the second complex-valued sample, wherein each of the plurality of vectors is associated with a respective vector direction computed according to $(\cos(\alpha_j), \sin(\alpha_j))$, and wherein $\alpha_j$ is an angle defined between a point of origin of the complex-valued plane and a respective intersection point for the $j^{th}$ line of the plurality of tangent lines with the circle representation.

5. The method of claim 1, wherein determining the clipped complex-valued sample comprises:
   selecting the one of the plurality of different tangent lines according to a tangent value, selected from a plurality of tangent values, closest to a sample tangent value computed for the second complex-valued sample, wherein each of the plurality of tangent values corresponds to a tangent value, $\tan(\alpha_j)$, and wherein $\alpha_j$ is an angle defined between a point of origin of the complex-valued plane and a respective intersection point for the $j^{th}$ line of the plurality of tangent lines with the circle representation.

6. The method of claim 5, selecting the one of the plurality of different tangent lines comprises:
   selecting the one of the plurality of different tangent lines according to a binary search performed to select the tangent value, from the plurality of tangent values, closest to the sample tangent value computed for the second complex-valued sample.

7. The method of claim 1, wherein at least some of the plurality of different tangent lines are defined in pre-determined orientations such that determination of the clipped complex-valued sample is computed, at least in part, based on pseudo-multiplication operations that reduce the number of actual multiplication operations required to determine the clipped complex-valued sample.

8. The method of claim 1, wherein h represents the magnitude of a complex-valued clipping threshold.

9. The method of claim 1, wherein the second complex-valued sample is the first complex-valued sample.

10. A crest factor reduction (CFR) system comprising:
    a controller configured to:
       receive a first complex-valued sample of a signal for radio transmission;
       determine a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane; and
       process the signal using the determined clipped complex-valued sample to produce a resultant CFR signal; and
    an amplifier to amplify the resultant CFR signal.

11. The system of claim 10, wherein the controller comprises:
    a filter chain, configured to apply to the received signal CFR processing based on clipping the received signal according to, at least in part, the determined clipped complex-value sample, the filter chain comprising one or more CFR stages that each includes a respective clipping module coupled, at an output of the respective clipping module, to a respective filter.

12. The system of claim 10, wherein the controller configured to determine the resultant clipped complex-valued sample is configured to:
    map, using a sequence of mapping operations, the first complex-valued sample to the associated second complex-valued sample located in a mapped region of the complex-valued plane;
    select an optimal line from the plurality of different tangent lines;
    project the second complex-valued sample to the optimal line selected from the plurality of different tangent lines; and
    apply a reverse-mapping sequence, based on the sequence of mapping operations, to compute the clipped complex-valued sample.

13. The system of claim 12, wherein the mapped region is a bisector region of a first quadrant of an x-y plane satisfying the constraints x≥0, y≥0, and x≥y.

14. The system of claim 10, wherein the controller configured to determine the clipped complex-valued sample is configured to:
    select the one of the plurality of different tangent lines according to a binary search performed to select a vector, $\vec{a}$, from a plurality of vectors, with an associated direction closest to a sample direction defined for the second complex-valued sample, wherein each of the plurality of vectors is associated with a respective vector direction computed according to (cos($\alpha_j$), sin ($\alpha_j$)), and wherein $\alpha_j$ is an angle defined between a point of origin of the complex-valued plane and a respective intersection point for the $j^{th}$ line of the plurality of tangent lines with the circle representation.

15. The system of claim 10, wherein the controller configured to determine the clipped complex-valued sample is configured to:
    select the one of the plurality of different tangent lines according to a binary search performed to select a tangent value, from a plurality of tangent values, closest to a sample tangent value computed for the second complex-valued sample, wherein each of the plurality of tangent values corresponds to a tangent value, tan ($\alpha_j$), and wherein $\alpha_j$ is an angle defined between a point of origin of the complex-valued plane and a respective intersection point for the $j^{th}$ line of the plurality of tangent lines with the circle representation.

16. The system of claim 10, wherein at least some of the plurality of different tangent lines are defined in pre-determined orientations such that determination of the clipped complex-valued sample is computed, at least in part, based on pseudo-multiplication operations that reduce the number of actual multiplication operations required to determine the clipped complex-valued sample.

17. The system of claim 10, wherein h represents the magnitude of a complex-valued clipping threshold.

18. The system of claim 10, wherein the second complex-valued sample is the first complex-valued sample.

19. A non-transitory computer readable media programmed with instructions, executable on a processor, to:
    receive a first complex-valued sample of a signal for radio transmission;
    determine a resultant clipped complex-valued sample for the first complex-valued sample, resulting from projection of a second complex-valued sample, associated with the first complex-valued sample, into a selected one of a plurality of different tangent lines that are tangential to a circle representation with a radius h in a complex-valued plane; and
    process the signal using the determined clipped complex-valued sample to produce a resultant CFR signal.

* * * * *